United States Patent [19]
Nguyen

[11] Patent Number: 4,840,530
[45] Date of Patent: Jun. 20, 1989

[54] TRANSFER APPARATUS FOR SEMICONDUCTOR WAFERS

[76] Inventor: Loc H. Nguyen, 1617 Whittenburg, Fort Worth, Tex. 76134

[21] Appl. No.: 197,682

[22] Filed: May 23, 1988

[51] Int. Cl.⁴ .............................................. B65G 65/30
[52] U.S. Cl. .................................... 414/404; 206/453; 206/454; 294/87.1; 414/417; 414/416
[58] Field of Search ....................... 414/416, 417, 404; 294/87.1

[56] References Cited

U.S. PATENT DOCUMENTS

| | | | |
|---|---|---|---|
| 4,023,691 | 5/1977 | Perel | 294/87.1 X |
| 4,466,766 | 8/1984 | Geren et al. | 294/87.1 X |
| 4,568,234 | 2/1986 | Lee et al. | 414/417 X |
| 4,611,966 | 9/1986 | Johnson | 414/417 X |

Primary Examiner—Robert J. Spar
Assistant Examiner—Robert S. Katz
Attorney, Agent, or Firm—Arthur F. Zobal

[57] ABSTRACT

An apparatus automatically transfers semiconductor wafers between plastic wafer boats and closed bottom quartz boats. The apparatus has a wafer elevator for elevating the wafers in a plastic boat to a position where the wafers can be retained by first and second retainer walls. The retainer walls are pivotable relative to one another between open and closed positions. In the closed position, the retainer walls contact the wafers at a point located beneath their centers of gravity. The retainer walls transfer the wafers between the wafer elevator and the quartz boat, which becaue of its closed bottom can only be entered from the top. The retainer walls transfer the wafers to and from the quartz boat by descending into the quartz boat through its top. Once inside of the quartz boat, the retainer walls can be pivoted between the open and closed positions to release or retain wafers.

4 Claims, 17 Drawing Sheets

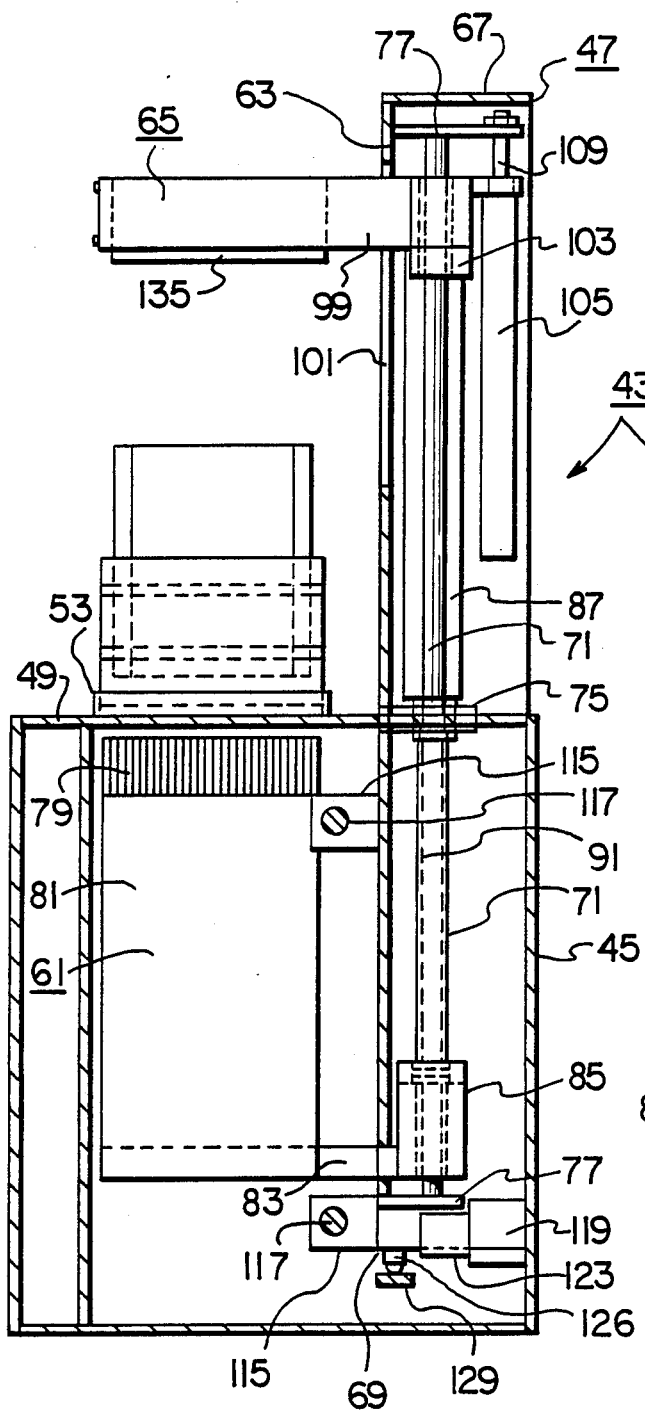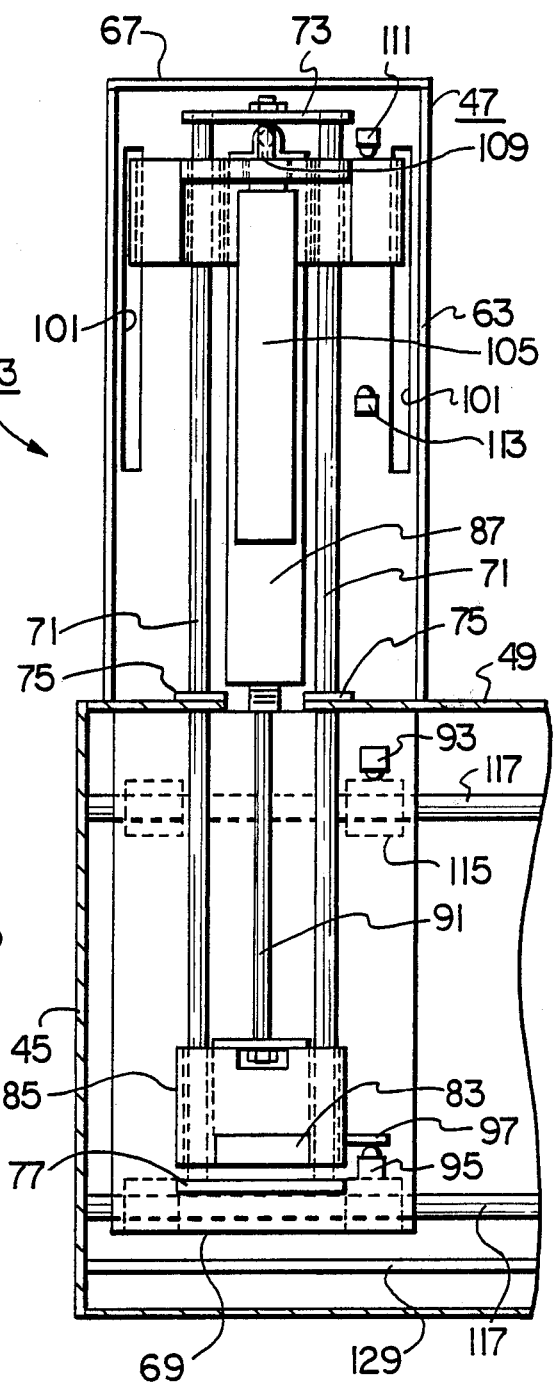
FIG. 4
FIG. 5

TRANSFER APPARATUS FOR SEMICONDUCTOR WAFERS

FIELD OF THE INVENTION

The present invention relates to apparatuses which are used to transfer semiconductors from one wafer container to another.

BACKGROUND OF THE INVENTION

Semiconductor wafers form the basis for the manufacture of integrated circuits onto semiconductor chips. Wafers undergo one or more types of processing resulting in the formation of microcircuits thereon. After processing, the wafers are cut into chips, with each chip containing an individual microcircuit.

The semiconductor wafers are of circular circumference and are very thin. The wafers, which are typically made of silicon or germanium, are fragile and as such are particularly vulnerable to breaking when handled. The wafers are typically stored in plastic containers or wafer boats. The wafer boats have a plurality of parallel transverse grooves or slots for receiving individual wafers.

One of the steps in the manufacture of some types of integrated circuits on the wafers involves placing the wafers in a high temperature oven wherein the wafers undergo a chemical diffusion process. Before the wafers are placed in the oven however, the wafers are transferred from a plastic boat to a wafer boat made of quartz. Quartz wafer boats are better suited to the high oven temperatures than are plastic wafer boats. When the diffusion process is complete, the wafers are then transferred back to the plastic wafer boat from the quartz wafer boat.

Prior art automatic transfer apparatuses transfer wafers from plastic wafer boats to open bottom quartz wafer boats. Both the plastic wafer boats and the open bottom quartz wafer boats are similar in that both have open bottoms which allow wafer elevators to enter the boats through the open bottom and push the wafers out through the top for removal. However, some types of quartz wafer boats are closed bottom and are therefore unable to receive wafer elevators from underneath the quartz boats. The only access into these closed bottom quartz boats is through the top. In the prior art, the wafers are transferred to and from closed bottom quartz boats manually. Such manual transfer is time consuming because of the large amount of time that must be taken to carefully handle each wafer, and costly because some wafers are inevitably broken in the transfer process. Therefore, what is needed is an automatic method of transferring wafers in and out of closed bottom quartz boats.

It is an object of the present invention to provide an apparatus that will automatically transfer semiconductor wafers to and from closed bottom quartz boats.

BRIEF DESCRIPTION OF DRAWINGS

FIG. 4 is a schematic cross-sectional right side view of the apparatus of FIG. 3.

FIG. 5 is a schematic rear cut away view of the apparatus of FIG. 3.

DESCRIPTION OF PREFERRED EMBODIMENT

Figure 1:
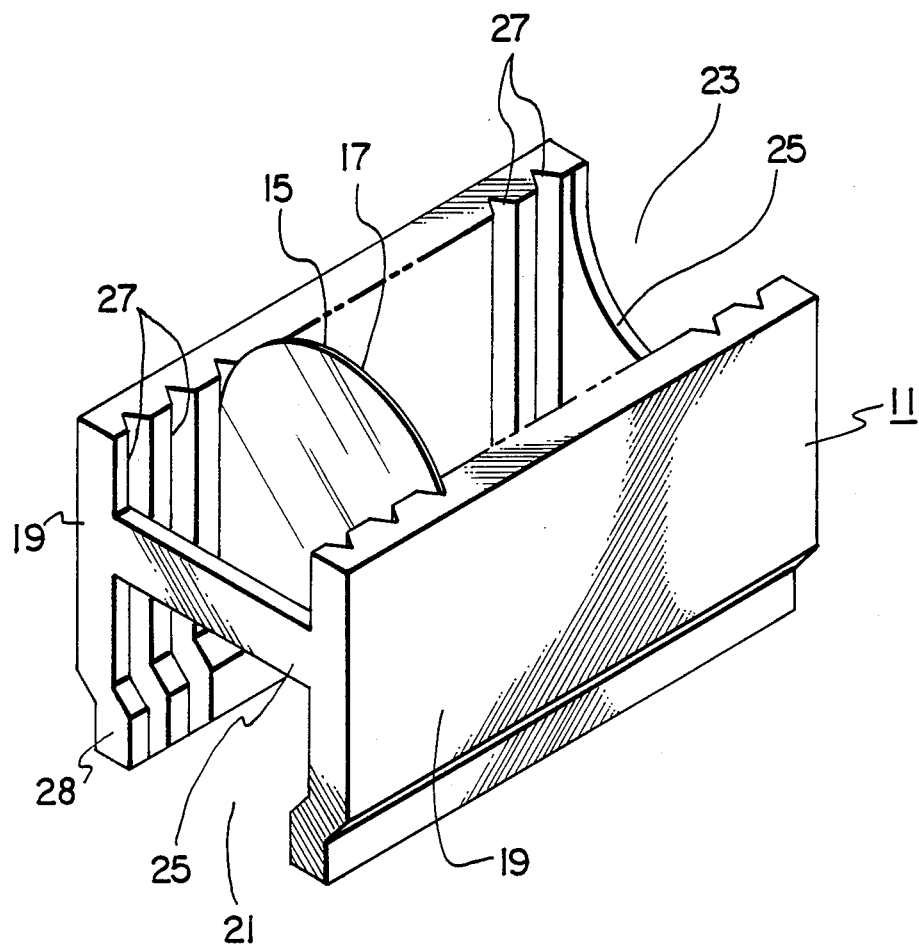
FIG. 1 is a schematic isometric view of a plastic wafer boat.
Figure 2:
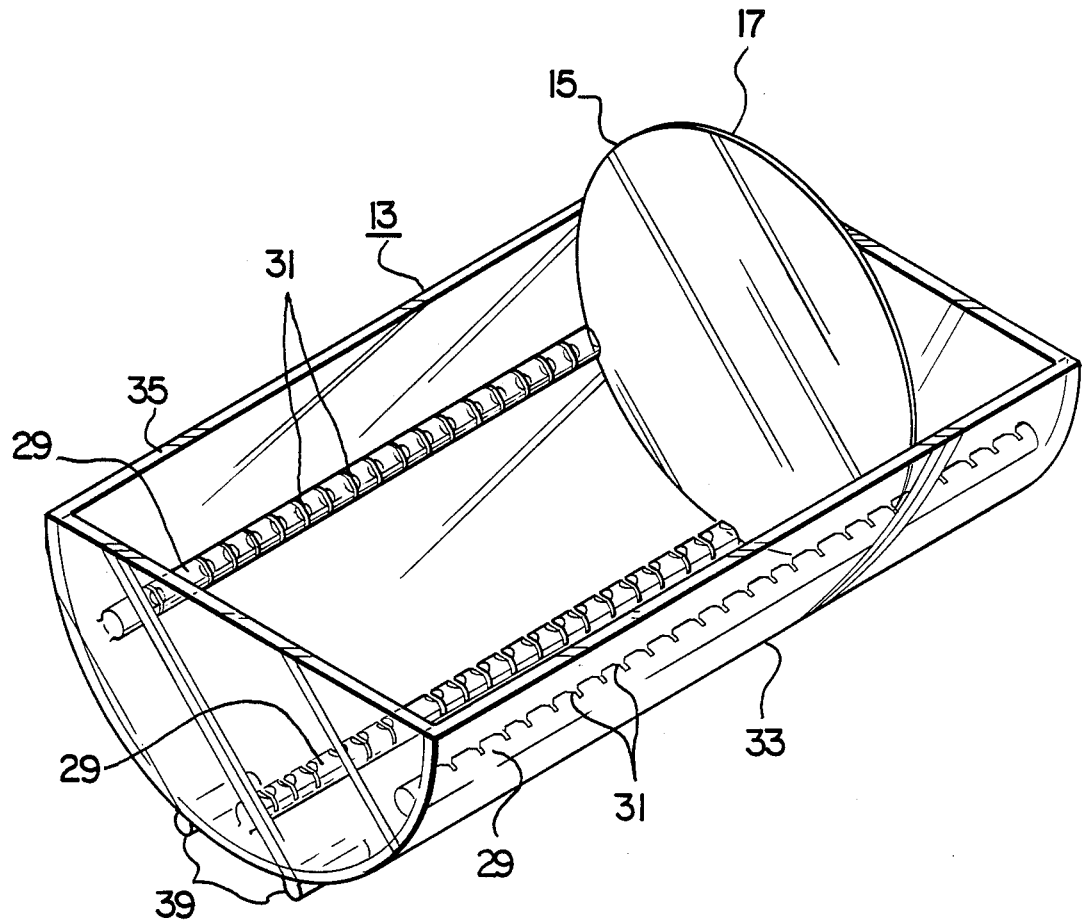
FIG. 2 is a schematic isometric view of a closed bottom quartz wafer boat.

In FIGS. 1 and 2, there are shown respective isometric views of a plastic wafer boat 11 and a quartz wafer boat 13. The wafer boats are utilized as containers for semiconductor wafers 15. Semiconductor wafers are typically made of silicon and germanium. The materials of the wafers, together with the thinness of each wafer, as illustrated by the narrow edge surfaces 17, make the wafers 15 fragile. Each wafer 15 is circular for most of its circumference with the exception of a small flat portion (not shown). Because of this near circular circumference, each wafer has a center of gravity which is very close to the center of the circular circumference.

The plastic wafer boat 11 has two vertical sides 19, an open bottom 21, and an open top 23. The sides are joined together at the ends 25 of the boat. The interior portions of the sides have plural slots 27 that are parallel to one another. The slots 27 receive the edge surfaces 17 of wafers 15 such that the wafers are oriented perpendicularly to the sides and are vertical. The edge surfaces of the wafers are exposed through the open bottom 21 and open top 23. Thus, wafer transfer means for removing or replacing wafers in the plastic boats can enter the boat through the open bottom and push the wafers out through the open top. The plastic wafer boats are conventional and standardized in that each plastic boat has slots for twenty five wafers, which slots are spaced 3/16" apart center to center. The lower ends of the vertical sides form legs 28 upon which the boats rest.

The quartz wafer boat 13 is of the closed bottom or half shell type. Quartz boats are used to contain the wafers in lieu of the plastic boats whenever high temperatures are to be encountered by the wafers. Such high temperatures are developed in diffusion ovens; one of the steps in the manufacture of some semiconductor chips. The shell prevents any wafer transfer means from entering the boat through the boat bottom to remove wafers. Thus, with such a closed bottom quartz boat 13, wafer transfer means for removing or replacing wafers in the quartz boat can enter the quartz boat only through the open top.

The half shell 33 that makes up the bottom and sides of the boat is one-half of a hollow cylinder. The quartz boat 13 has a plurality of longitudinal supports 29 mounted to the inside of the shell 33 and extending the length of the shell. The longitudinal supports are positioned to contact the bottom and sides of wafers. The longitudinal supports 29 have a plurality of parallel slots 31 for receiving the edge surfaces of wafers. The slots 31 in any one longitudinal support 29 correspond to the slots in the other longitudinal supports such that a wafer can be placed in one slot of each longitudinal support. The uppermost longitudinal supports are positioned a short distance below the lips 35 of the shell 33, such that the uppermost longitudinal supports contact the edge surfaces of the wafers at points below the centers of gravity of the wafers. The inside diameter of the shell 33 is slightly greater than the diameter of the wafers so that a gap 37 is formed between the inner surface of the shell and the edge surfaces 17 of the wafers 15. At the shell lips 35, the gap 37 between the wafers and the shell is open and thus may receive retainer wall means to remove and load wafers into the boat. The quartz wafer boats have legs 39 upon which the boats rest.

There are at least seven types of closed bottom quartz boats (see Table 1). The quartz boats are categorized according to their numerical wafer capacity, number of slots, spacing between the slots from center to center and overall length. For purposes of description hereinafter, the different types of quartz boats will be referred to by their type number, as in for example type I quartz boat, type II quartz boat, etc.

TABLE 1

| Type | Wafer Capacity | Number of Slots | Slot Spacing (inches) | Length (inches) |
| --- | --- | --- | --- | --- |
| I | 25 | 25 | 3/16 | 5.6 |
| II | 50 | 50 | 3/32 | 5.6 |
| III | 50 | 25 | 3/16 | 5.6 |
| IV | 25 | 13 | 3/8 | 5.6 |
| V | 25 | 25 | 3/8 | 14.0 |
| VI | 50 | 50 | 3/16 | 14.0 |
| VII | 100 | 100 | 3/32 | 14.0 |

Figure 3:
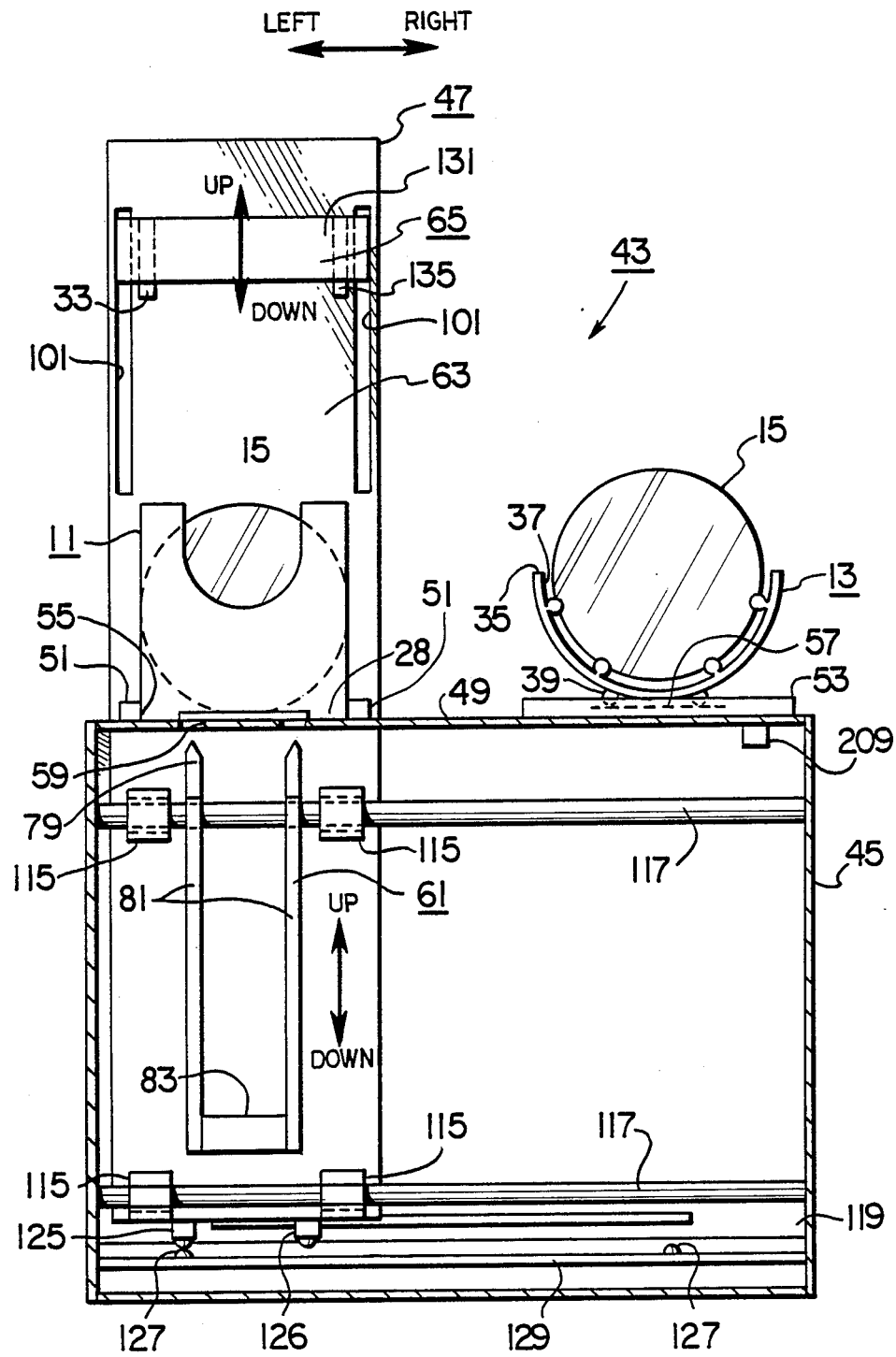
FIG. 3 is a schematic front view of the apparatus of the present invention with the enclosure cut away, in accordance with a preferred embodiment.

The transfer apparatus 43 of the present invention is shown in FIGS. 3–5 in accordance with a preferred embodiment. The transfer apparatus 43 is used for automatically transferring wafers 15 between plastic boats 11 and quartz boats 13. The transfer apparatus shown in FIGS. 3–5 is used for types I—III quartz boats. The transfer apparatus includes a rigid enclosure 45 and a main assembly 47 which is movable relative to the enclosure. The transfer apparatus utilizes a pneumatic power system. Thus, in the description hereinafter, the mover components (pneumatic cylinders) and logic components, which are conventional, are pneumatically powered.

The enclosure 45 houses some of the mover components and the logic components which control the sequence of operation and which will be described in more detail hereinafter. Referring specifically to FIG. 3, the enclosure 45 also provides a fixed stand upon which the main assembly 47, which participates in the actual transfer of wafers to and from quartz boats, moves. The enclosure 45 has a top portion 49 upon which are placed two placement blocks 51, 53, one for the plastic boat 11 and one for the quartz boat 13. The placement blocks 51, 53 have alignment notches 55, 57 for receiving the respective legs 28, 39 of the respective boats 11, 13 to insure the correct placement of the boats on the transfer apparatus. The top portion 49 of the enclosure 45 underneath the plastic boat placement block 51 has two slots 59 extending therethrough. The slots 59 allow the passage of a wafer elevator 61, which is usually located inside of the enclosure 45, up through the bottom of the plastic boat 11, wherein the wafers may be pushed upwardly.

The main assembly 47 includes the wafer elevator 61, a mounting member 63, and a retainer hat 65 (see FIGS. 3-5). The mounting member 63 is generally rectangular and provides a mount for the wafer elevator 61 and the retainer hat 65. The mounting member 63 has an upper end portion 67 and a lower end portion 69 and is positioned at the rear of the enclosure 45 so as not to interfere with the placement of wafer boats upon the transfer apparatus by an operator. The mounting member 63 has parallel rails 71 in the form of rods that extend from the upper end portion to the lower end portion. The rails 71 are secured in position by an upper anchor plate 73, intermediate anchor plates 75, and a lower anchor plate 77.

The conventional wafer elevator 61 is coupled to the lower end portion 69 of the mounting member 63 so as to be within the enclosure 45 when not in use. The wafer elevator is generally U-shaped (see FIG. 3) with long sides 81 and a narrow base 83. At the upper ends of the sides 81 are slots 79 for receiving the edge surfaces 17 of wafers 15. The slots 79 correspond in number and spacing to the slots 27 in the plastic boats 11, so that the wafer elevator 61 lifts all of the wafers in a plastic boat. The wafer elevator 61 is positioned within the enclosure such that the sides 81 of the wafer elevator can pass through the slots 59 in the plastic boat placement block 51. The base 83 of the wafer elevator 61 extends rearwardly towards the lower end portion of the rails 71, where the base is coupled to a travel block 85. The wafer elevator travel block 85 is coupled to the rails 71 so as to allow up and down movement of the travel block along the rails whenever such movement is powered by a wafer elevator cylinder 87. The wafer elevator cylinder 87 is mounted longitudinally between the upper end portion of the rails. The casing of the cylinder 87 is mounted to the mounting member 63 by way of the upper anchor plate 73. The piston rod 91 from the cylinder 87 is coupled to the upper end of the travel block 85. The travel block 85, and thus the wafer elevator 61, has maximum upper and lower positions with respect to the enclosure 45, which positions are determined by the placement of conventional pneumatic limit valves 93, 95. The limit valves 93, 95 are actuated by a tab 97 projecting outwardly from the travel block.

Like the wafer elevator 61, the retainer hat 65 is also provided with up and down movement. The retainer hat 65 has lateral support members 99 which extend rearwardly through slots 101 in the mounting member 63 and towards the upper end portion of the rails, where the support members are coupled to a second travel block 103. The retainer hat travel block 103 is coupled to the rails 71 so as to allow up and down movement of the travel block whenever such movement is powered by a retainer hat cylinder 105. The retainer hat cylinder 105 is mounted adjacent to the wafer elevator cylinder 87. The casing of the retainer hat cylinder is coupled to the retainer hat travel block 103 while the piston rod 109 is coupled to the upper anchor plate 73. The retainer hat travel block 103, and thus the retainer hat 65 itself, have maximum upper and lower positions with respect to the enclosure, which positions are determined by the placement of pneumatic limit valves 111, 113. The limit valves 111, 113 are placed in the path of the travel block 103 so as to be directly actuated by the travel block.

The main assembly 47 is provided with lateral movement so that the retainer hat 65 may be positioned alternatively over the plastic boat 11 or the quartz boat 13. The mounting member 63 is mounted, via travel blocks 115, to laterally extending parallel rails 117 located inside of the enclosure 45. The mounting member travel blocks 115 allow the mounting member 63 to move from side to side along the lateral rails whenever such movement is powered by a mounting member cylinder 119. The mounting member cylinder 119 is mounted adjacent to one of the lateral rails. The casing of the mounting member cylinder is coupled to the interior of the enclosure while the moveable piston 123 is coupled to the mounting member 63. Limit valves 125, 126 are mounted to the main assembly 47 so as to be activated by projections 127 on a bar 129 mounted adjacent to and parallel to one of the lateral rails 117.

Figure 6:
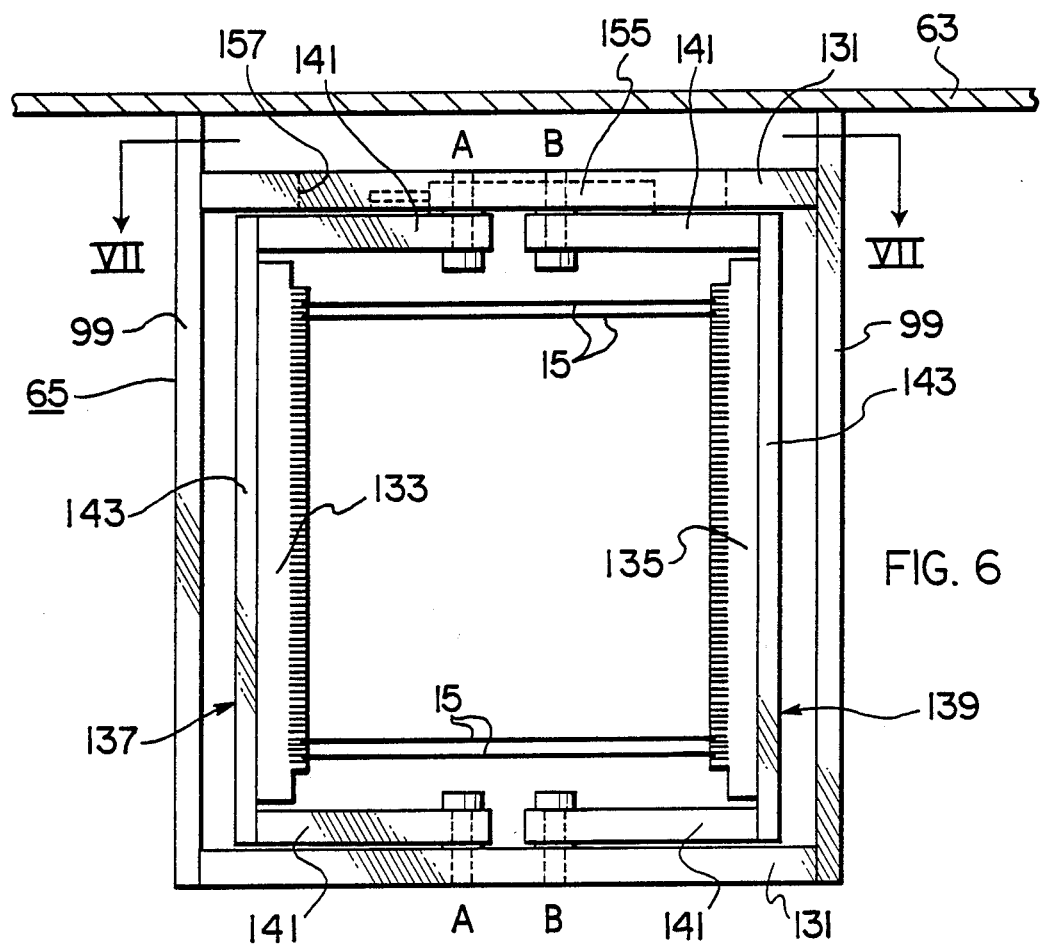
FIG. 6 is a schematic top plan view of the retainer hat.
Figure 7:
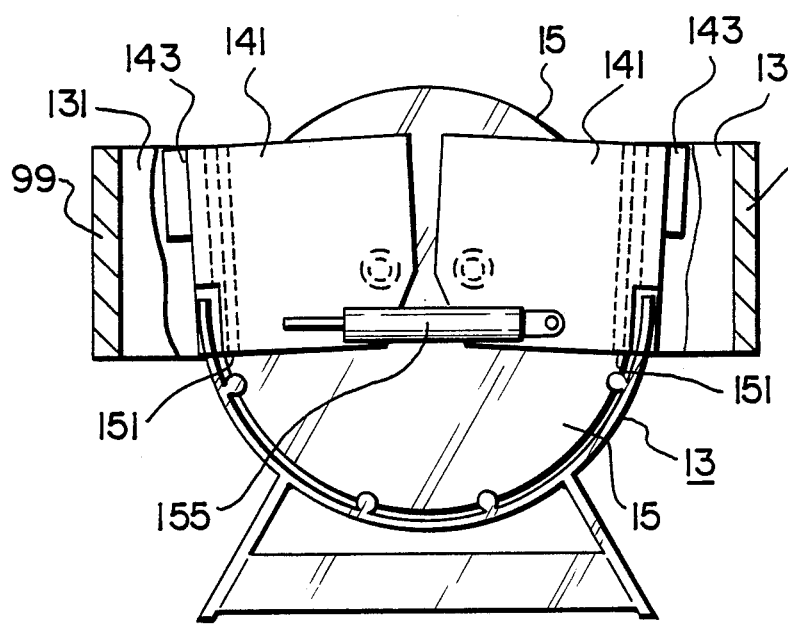
FIG. 7 is a schematic cross-sectional end view of the retainer hat taken at lines VII—VII of FIG. 6.

The retainer hat 65 is shown in more detail in FIGS. 6 and 7. The retainer hat 65 includes lateral support members 99, cross support members 131, first and second retainer walls 133, 135, and first and second pivot members 137, 139. The lateral support members 99 and the cross support members 131 are thin plates that are configured together to form a rectangular framework when viewed from the top as in FIG. 6. The lateral support members 99 extend out in front of the mounting member 63 and the cross support members 131 join the lateral support members together. Each pivot member 137, 139 is U-shaped when viewed from the top of the retainer hat as shown in FIG. 6, with the sides of each U-shaped pivot member being formed by pivot arms 141 and the base being formed by a support bar 143. The pivot arms 141 are square-like plates (see FIG. 7) which are coupled to the respective ends of the respective support bar 143. The pivot arms 141 of each pivot member 137, 139 are pivotally coupled to the insides of the cross support members 131 such that the open ends of the pivot members face each other and the respective support bars 143 are adjacent to the respective lateral support members 99. The pivot axis A, B of each pivot member 137, 139 is located near the inside ends of the respective pivot arms such that the respective support bar 143 and the respective retainer wall 133, 135, which is coupled to the support bar, can pivot up and down.

Figure 10:
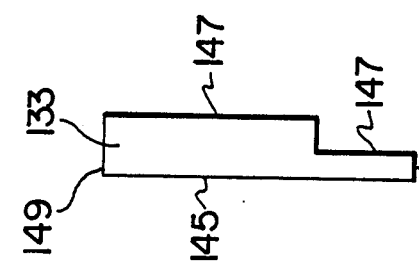
FIG. 10 is a schematic side view of the retainer wall of FIG. 8.
Figure 8:
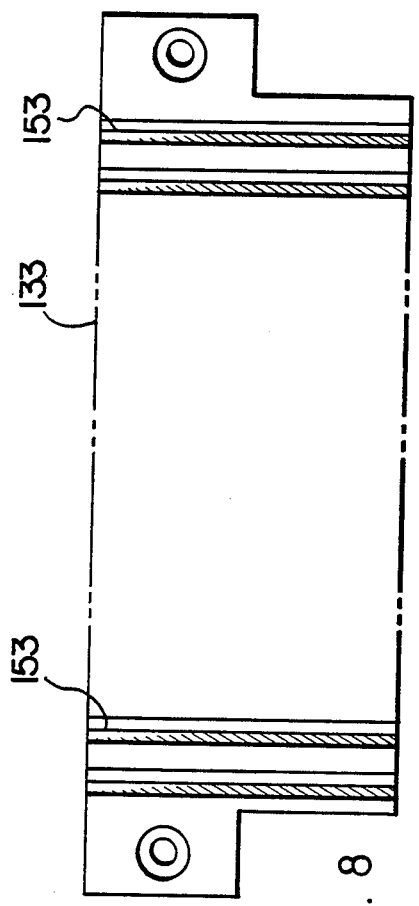
FIG. 8 is a schematic side view of the inner surface of one of the retainer walls, which retainer wall is used in conjunction with specific types of closed bottom quartz boats.
Figure 9:
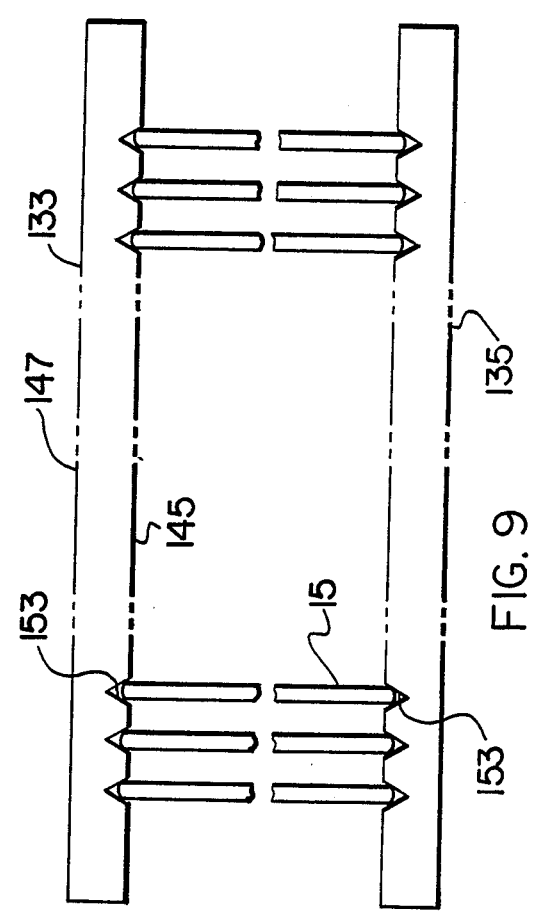
FIG. 9. is a schematic top view of two retainer walls in which wafers have been retained.

Referring to FIGS. 8 and 9, each of the first and second retainer walls 133, 135, which are used to grasp and lift the wafers to and from the boats, has an inside surface 145, an outside surface 147, and upper and lower edges 149, 151. The outside surfaces 147 of the first and second retainer walls are coupled to the respective first and second pivot member support bars 143 (see FIGS. 6 and 7) such that the first and second walls 133, 135 are in a generally vertical orientation, and such that the inside surfaces 145 of the walls face each other. The inside surfaces 145 have vertical slots 153 that extend upwardly from the lower edges 151. The slots 153 in each wall are parallel to one another and have a "V" shaped contour for receiving the edge surfaces of individual wafers. The slots 153 are spaced 3/16 inch apart, center to center, which is the spacing of the plastic boat slots 27. The slots 153 are spaced 3/16" apart, center to center, which is the spacing of the plastic boat slots 27. When the wafers are retained by the retainer walls, the edge surface of each wafer 15 contacts both surfaces of the respective "V" shaped slot 153 such that the wafer is lightly wedged into the slot. The lower end portion of each retainer wall is stepped whereby the thickness between the inside and outside surfaces 145, 147 at the lower edge 151 is reduced (see FIG. 10) such that the lower edge may be inserted into the quartz boat gap 37 between the boat 13 and the wafer edge surfaces 17 (see FIG. 7).

The retainer hat 65 has a retainer wall cylinder 155 located in a notch 157 cut into the underside of the rear cross support member 131 (see FIGS. 6 and 7). The casing of the retainer wall cylinder 155 is coupled to the rearmost pivot arm of one of the pivot members 139 while the piston rod of the cylinder is coupled to the rearmost pivot arm of the other of the pivot members 137. The cylinder 155 is coupled to the respective pivot arms 141 such that the pivot arms can be pivoted about the respective pivot axes A, B by the movement of the piston rod in the cylinder. The retainer walls 133, 135, and the lower edges 151 of the retainer walls in particular, are thus able to pivotally move over an arcuate path between open and closed positions. In the open position, the retainer wall lower edges 151 are able to enter the gap 37 between the quartz boat half shell 33 and the edge surfaces of the wafers, without disturbing the wafers. In the closed position, the retainer wall slots 153 contact the wafer edge surfaces at points located below the centers of gravity of the wafers. The range of motion of the retainer walls is limited to a short path by the cylinder 155.

Figure 11:
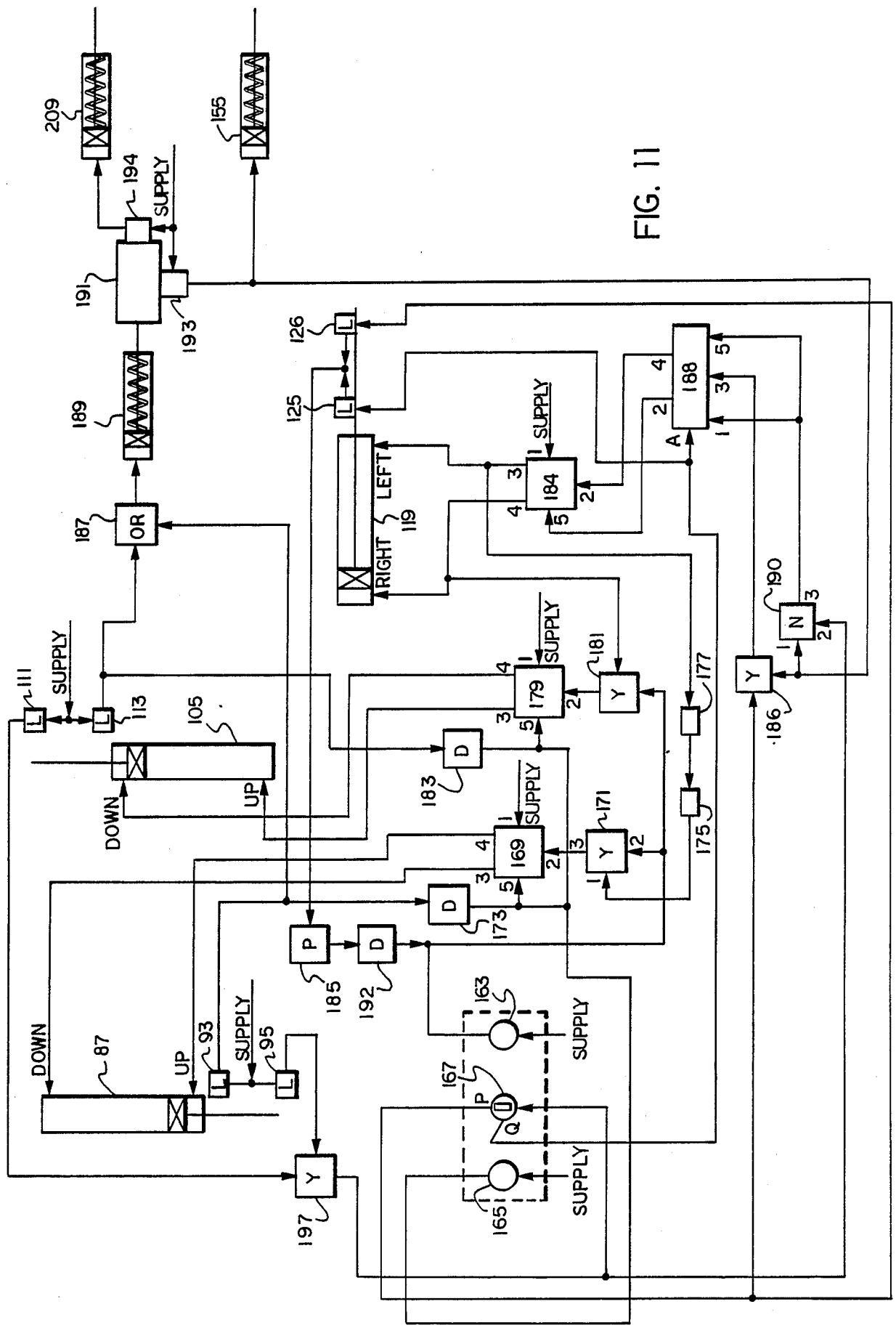
FIG. 11 is a schematic diagram of the pneumatic logic circuit which is used to control the operation of the apparatus of FIG. 3–5.

As mentioned hereinabove, the transfer apparatus 43 of the present invention utilizes a pneumatic power system which includes conventional power components in the form of pneumatic cylinders and conventional logic components in the form of miniature pneumatic moving part logic elements. The cylinders provide the means necessary to move the various assemblies and the logic modules provide the operational sequencing necessary for automatic operation. In FIG. 11, there is shown a schematic diagram of the pneumatic logic circuit. The circuit includes start and stop valves 163, 165, a mode select valve 167, wafer elevator cylinder drive means, retainer hat cylinder drive means, mounting means cylinder drive means, and retainer wall cylinder drive means.

The start and stop valves 163, 165 are normally off, momentary valves. Each valve is turned on by pressing an actuator button. As soon as the button is released, the valve shuts off. The mode select valve 167 is a manually operated dual output valve. The operator selects output P to transfer wafers from a plastic boat to a quartz boat, and selects output Q to transfer wafers from a quartz boat to a plastic boat.

The wafer elevator cylinder drive means includes a five port latch module 169, a YES module 171, a delay module 173, and the limit valves 93, 95 which are of the normally off type. The five port latch module 169 has the air supply, which is 50-80 psi, connected to the input at port 1 and the outputs at ports 3 and 4 are connected to the respective DOWN and UP ports of the wafer elevator cylinder 87. When air pressure is supplied to port 2, the air input at port 1 flows out at port 4. The output remains latched to port 4 even if air pressure is removed from port 2, until air pressure is applied to port 5, wherein the output shifts and latches to port 3. Ports 2 and 5 are mutually exclusive in that air does not appear simultaneously at both ports. The YES module 171 has the air supply connected to port 1 and the output at port 3 is connected to port 2 of the latch module 169. The air from port 1 appears at port 3 only if air is supplied to port 2. With the exception of pressure difference in the output air, the YES module is substantially similar in operation to an AND logic element. The input air at port 1 of the YES module 171 is connected in series with normally off boat sensor valves 175, 177, which are located in the respective placement blocks 51, 53 for the plastic and quartz boats. The limit valves 175, 177 are turned on, allowing air to flow, whenever boats are placed in the placement blocks. The delay module 173 allows the air input at port 1 to appear at the output port 2 after a time delay. In the preferred embodiment, the time delay for the delay modules is set to 10 seconds.

The retainer hat cylinder drive means includes a 5 port latch module 179 configured similar to the latch module 169, a YES module 181, a delay module 183 and the limit valves 111, 113 which are also of the normally off type.

The mounting member cylinder drive means includes a 5 port latch module 184 which is configured similar to the latch module 169, a spring return relay 188, YES and NOT modules 186, 190, the normally off limit valves 125, 126, a pulse module 185, and a delay module 192. The relay 188 has a pilot input at port A. If air pressure is not applied to port A, the input port 3 is connected to output port 2 to provide air pressure to the LEFT port of the mounting member cylinder 119. Air is exhausted through the RIGHT port of the mounting member cylinder 119, through the latch module 184, through the relay 188 via port 4 which is connected to port 5, and out through a vent in the NOT module 190. If air pressure is applied to port A of the relay 188, then input port 3 is connected to output port 4 to provide air pressure to the RIGHT port of the mounting member cylinder 119. Air pressure is exhausted through the LEFT port of the mounting member cylinder 119, through the latch module 184, through the relay 188 via port 2 which is connected to port 1, and out through the vent in the NOT module 190. The NOT module 190 input at port 1 becomes the output at port 3, except when air pressure is applied to port 2. The pulse module 185 is connected in series between the output of the limit valve 125 and one of the inputs into the wafer elevator and retainer hat YES modules 171, 181. The output of the pulse module 185 is a short duration pulse of air pressure. The pulse module 185 resets when the input air pressure is dropped. The output of the limit valve 125 is also connected to one of the inputs of the YES module 186. The other input of the YES module 186 will be described hereinbelow.

Figure 14:
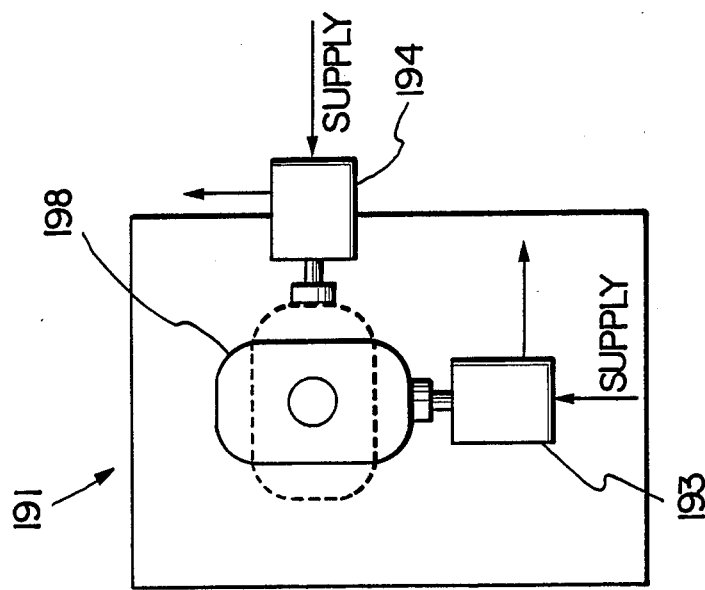
FIG. 14 is a rear view of the reduction means of FIG. 12.
Figure 13:
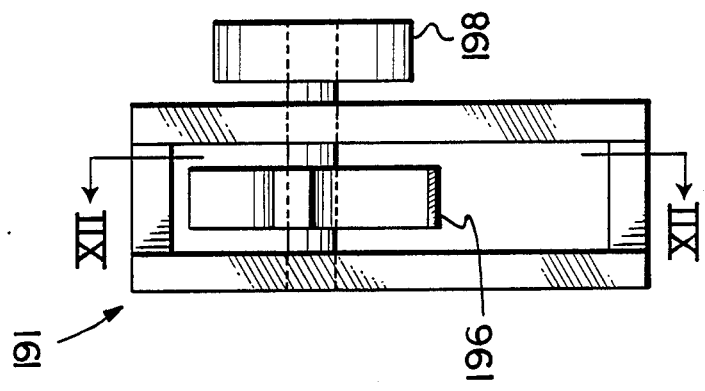
FIG. 13 is a side view of the reduction means of FIG. 12.
Figure 12:
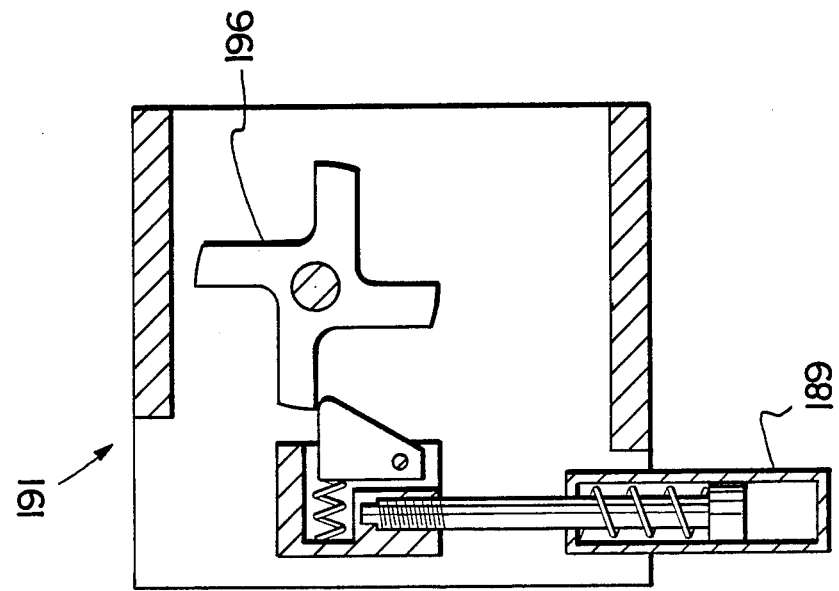
FIG. 12 is a front view of the reduction means and the sequencing cylinder.

The retainer wall cylinder drive means includes an OR module 187, a sequencing cylinder 189, reduction means 191, and a normally off valve 193 and an indexing valve 194, which is also normally off. The OR module 187 has two inputs, either one of which will appear at the output, whenever air pressure is applied to that input. The sequencing cylinder 189 has a piston rod 195 that alternates between "in" and "out" positions. When air is not supplied to the cylinder 189, the piston rod is maintained in the "in" position by an internal spring. Air supplied to the cylinder 189 from the OR module 187 will push the piston rod to the "out" position. The reduction means 191, which is conventional, opens the normally off valve 193 every other cycle of the sequencing cylinder 189. One cycle of the sequencing cylinder 189 involves the piston rod 195 moving from the "in" position to the "out" position and back to the "in" position. The reduction means 191, which is shown in FIGS. 12-14, has a four point star wheel 196 and a two point cam 198. The rotation of the cam is fixed to the rotation of the star wheel, which can only rotate in one direction. Every time the sequencing cylinder 189 moves to the "out" position, the star wheel 196 is rotated 90 degrees, wherein the cam 198 is also rotated 90 degrees. The cam 198 alternately opens the normally off valve 193 and the indexing valve 194.

TABLE 2

| Sequencing Cylinder Position | Retainer Wall Cylinder Position |
|---|---|
| IN | OPEN |
| OUT | CLOSE |
| IN | CLOSE |
| OUT | OPEN |

The normally off valve 193, when turned on by the reduction means 191, supplies air to the retainer wall cylinder 155 which moves the retainer walls 133, 135 to the "open" position (see Table 2). The retainer wall cylinder 155 is spring biased such that the retainer walls 133, 135 are in the "closed" position whenever air is removed from the retainer wall cylinder 155. The valve 193 also supplies air to the other input of the mounting member YES module 186. The indexing valve 194 will be described in more detail hereinafter.

The operation of the transfer apparatus 43 of the present invention in transferring wafers from a plastic boat 11 to a type I quartz boat 13 will now be described with reference to FIGS. 3–11. First, the operator places a full plastic boat 11 and an empty quartz boat 13 within the alignment notches 55, 57 of their respective placement blocks 51, 53, wherein the boats open the respective boat sensor valves 175, 177 and let air flow therethrough. Then, the operator turns the select valve 167 to the P position to transfer from the plastic boat. At this point, the sequencing cylinder 189 is in the "in" position, and the retainer wall cylinder 155 is in the "open" position. The operator then presses momentarily the start button 163, letting air flow momentarily into port 2 of the YES modules 171, 181. The wafer elevator YES module 171 has air pressure at both inputs and so presents air pressure to port 2 of the latch module 169. The output of the latch module 169 shifts to port 4 wherein the UP port of the wafer elevator cylinder 87 is pressurized and the wafer elevator 61 moves up through the bottom 21 of the plastic boat 11 to the "up" position. As the wafer elevator 61 extends upwardly into the plastic boat, the lower edge surfaces 17 of the wafers 15 are received by the vertical slots 79 in the wafer elevator. The slots 79 in the wafer elevator hold the wafers in the same orientation and arrangement as in the plastic boat. In the "up" position, the up limit valve 93 is opened allowing air to flow to the delay module 173 and to the OR module 187. The OR module 187 causes the sequencing cylinder 189 to extend to the "out" position, wherein the valve 193 is shut off and the retainer wall cylinder 155 moves to the "closed" position and the retainer wall cylinder 155 causes the retainer walls 133, 135 to close around the wafers 15. (For type I quartz boats, the indexing cylinder 209 is disconnected.) The lower end portion of the retainer walls 133, 135 contact each wafer edge surface 17 at points located below the wafer center of gravity, thus ensuring that each wafer will not slip out of the retainer hat. After a 10 second delay, during which time the retainer walls 133, 135 close to retain the wafers, air pressure is applied to port 5 of the latch module 169, causing the output to be shifted and latched to port 3. Air pressure is now applied to the DOWN port of the wafer elevator cylinder 87 and the wafer elevator 61 retracts to the "down" position. As the wafer elevator 61 leaves the "up" position, the up limit switch 93 is cut off, thus removing air pressure from the delay module 173 and the sequencing cylinder 189, which returns to the "in" position. The retainer wall cylinder 155 remains in the "closed" position wherein the wafers 15 continue to be retained by the retainer walls 133, 135.

When the wafer elevator 61 returns to the "down" position, the down limit valve 95 is opened, allowing air pressure to flow to one of the inputs of a YES module 197. The other input receives air pressure from the up position limit valve 111 of the retainer hat cylinder 105. The output of the YES module 197 goes to port 2 of the NOT module 190, where it causes air pressure to be applied to the output at port 3. This applies air pressure to port 2 of the latch module 184, via ports 5 and 4 of the relay 188, wherein the latch module output is switched and latched to port 4. Air pressure is now supplied to the RIGHT port of the mounting member cylinder 119. The mounting member cylinder 119 moves the mounting member 63, and the entire main assembly 47, to the right, wherein the wafers 15 and the retainer hat 65 are positioned over the quartz boat 13. When the main assembly 47 reaches the rightmost position, the mounting member limit valve 126 is opened, causing a pulse of air pressure to be applied to the retainer hat YES module 181 after a time delay caused by the delay module 192. This allows the YES module 181 to output air pressure to port 2 of the retainer hat cylinder latch module 179, wherein the output of the latch module is shifted and latched to port 4. Air pressure is applied to the DOWN port of the retainer hat cylinder 105 and the retainer hat 65 descends down to the quartz boat. The wafer edge surfaces 17 are received by the slots 31 in the quartz boat 13, which slots correspond exactly to the plastic boat slots 27 and the retainer wall slots 153. The retainer hat cylinder 105 opens the lower limit valve 113, allowing air to flow to the delay module 183 and to the sequencing cylinder 189. The delay module 183 delays 10 seconds before producing air pressure to ports of the latch module 179. During the delay, the sequencing cylinder 189 moves to the "out" position, causing the retainer wall cylinder 155 and the retainer walls 133, 135 to open, thereby releasing wafers 15 into the quartz boat 13.

As the retainer walls 133, 135 are opened to release the wafers, the retainer walls pivot upwardly a short distance. This slight pivoting movement of the retainer walls 133, 135 also results in the walls moving outwardly and away from the wafer edge surfaces 17, thus breaking any contact between the wafers 15 and the retainer walls 133, 135. In the open position, the lower edges 151 of the retainer walls 133, 135 are positioned within the gap 37 between the quartz boat shell 33 and the wafer edge surfaces 17 such that the retainer wall lower edges can be removed from the gap without disturbing the wafers. Thus, when the retainer walls 133, 135 are in the closed position, the lower edges 151 are actually positioned slightly under an imaginary horizontal line extending through the center of gravity of each wafer. When the retainer walls are in the "open" position, the distance between the lower edges 151 is slightly greater than the diameter of each wafer 15, thus enabling the retainer walls to be either withdrawn or inserted into the gap 37 without disturbing the wafers.

After the 10 second delay is past, air pressure appears at port 5 of the latch module 179 and the output of the latch module changes and latches to port 3. Air pressure is applied to the UP port of the retainer hat cylinder 105, causing the retainer hat 65 to go up. Upward movement of the retainer hat closes the down position limit valve 113, shutting air pressure to the sequencing cylinder 189 and the delay module 183. The sequencing cylinder moves to the "in" position and the retainer wall cylinder 155 remains in the "open" position. The delay module 183 shuts off air to port 5 of the latch module 179. When the retainer hat 65 reaches the "up" position, the upper limit valve 111 is opened, wherein air pressure is supplied to both inputs of the YES module 197. The YES module 197 supplies air pressure to the LEFT port of the mounting member cylinder 119, causing the main assembly and the retainer hat to move back to over the plastic boat. The transfer operation from the plastic boat to the quartz boat is now complete.

In transferring wafers from the quartz boat to the plastic boat, the operator places an empty plastic boat and a full quartz boat within the alignment notches 55, 57 of the respective placement blocks 51, 53. The boats open the respective boat sensor valves 175, 177 and let air flow therethrough. The operator turns the mode select valve 167 to the Q position causing air pressure to be applied to port A of the relay 188, wherein ports 3 and 4 are now connected and ports 1 and 2 are also connected. Thus, air pressure is applied to port 2 of the latch module 184. The output of the latch module 184 shifts and latches to port 4 and applies air pressure to the RIGHT port of the mounting member cylinder 119. The main assembly 47 is moved to the right to position the retainer hat over the quartz boat. The valve 126 is opened when the main assembly reaches the rightmost position, sending a pulse of air pressure to one of the inputs of the retainer hat YES module 181. The other input into the YES module 181 is from port 4 of the latch module 184. The YES module 181 applies air pressure to port 2 of the latch module 179, shifting and latching the output to port 4. This applies air pressure to the DOWN port of the retainer hat cylinder 105, causing the retainer hat 65 to go down into the quartz boat. At the "down" position of the retainer hat 65, the down limit valve 113 is opened, applying air pressure to the sequencing cylinder 189. The sequencing cylinder 189 closes the valve 193 which closes the retainer wall cylinder 155, thereby closing the retainer walls. As discussed hereinabove, the retainer walls, when closed, contact the edge surfaces of the wafers at points located below the wafer centers of gravity.

After a time delay, the delay module 183 applies air pressure to port 5 of the latch module 179, shifting the output to port 3. Air pressure is now applied to the up port of the retainer hat cylinder 105, causing the retainer hat 65 to go upwards.

When the retainer hat reaches the upmost position, the up limit valve 111 is opened, supplying air pressure to the YES module 197. This causes the mounting member cylinder latch module 184 to apply air pressure to the LEFT port of the mounting member cylinder 119, thereby causing the main assembly 47 to move to the left and position the retainer hat 65 over the plastic boat. At the leftmost position of the main assembly, the limit valve 125 is opened and a pulse of air pressure is sent to the wafer elevator cylinder YES module 171. This causes air pressure to be applied to the UP port of the wafer elevator cylinder 87 via the latch module 169 and raises the wafer elevator 61 to the "up" position. At the "up" position of the wafer elevator 61, the up limit valve 93 is opened, and air pressure is sent to the sequencing cylinder 189, causing the retainer walls 133, 135 to open and deposit the wafers into the slots of the wafer elevator 61. After a time delay, air pressure is applied to the DOWN port of the wafer elevator cylinder 87 and the wafer elevator retracts into the enclosure 45. The wafers are deposited into the plastic boat. The transfer operation from the quartz boat to the plastic boat is now complete.

One aspect of the operation of the transfer apparatus of the present invention is that only one cylinder is actuated at any given time. This limitation of movement results in a safe transfer of wafers between boats. Another aspect is that the retainer wall cylinder 155 is fail safe by being spring biased in the closed position. If for some reason, the air supply would fail during a transfer operation, the retainer walls would continue to retain the wafers by maintaining the closed position. The retainer wall cylinder can be opened only by the application of air pressure.

The stop valve 165 is provided to enable an operator to stop the transfer operation at any point. When activated, the stop valve 165 supplies air pressure to the DOWN port of the wafer elevator cylinder 87 and the UP port of the retainer hat cylinder 105.

The transfer apparatus 43 of the present invention can also be used for transferring wafers to and from a type II quartz boat. A type II quartz boat contains 50 wafers, or twice as many wafers as a plastic boat. The overall lengths of a type II quartz boat and a plastic boat are the same; the quartz boat has the wafers spaced 3/32 of an inch apart whereas the plastic boat has wafers spaced 3/16 of an inch apart.

The transfer apparatus used for transferring wafers to and from a type II quartz boat is similar to the transfer apparatus described hereinabove for transferring wafers to and from a type I quartz boat with the following exceptions: the retainer walls 199 in the retainer hat 65 have different slot configurations; and some additional operational steps are required for type II quartz boats.

Figure 15:
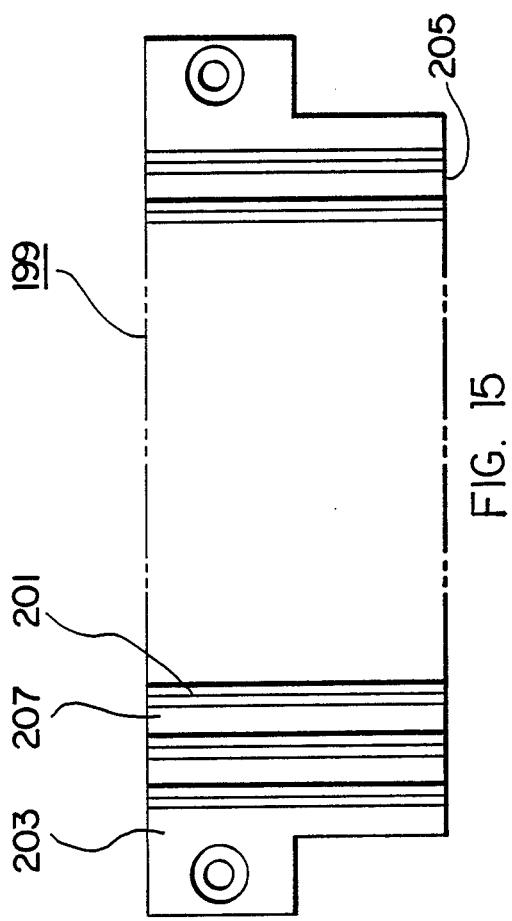
FIG. 15 is a schematic side view of the inner surface of one of the retainer walls, which retainer wall is used in conjunction with other types of closed bottom quartz boats.
Figure 16:
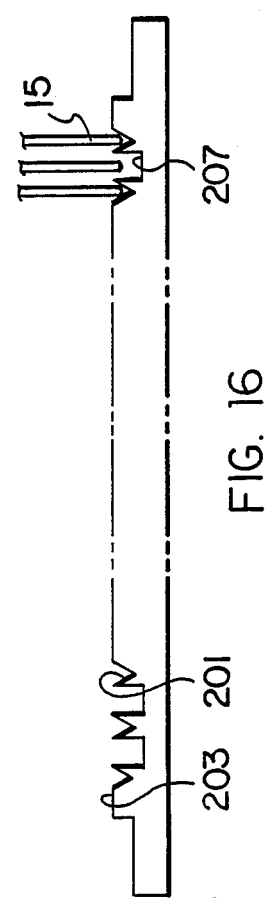
FIG. 16 is a schematic top view of the retainer wall of FIG. 11.

Referring to FIGS. 15 and 16, the retainer wall 199 which is used for a type II quartz boat has a plurality of vertical slots 201 on the inside surface 203 the wall. The vertical slots 201 extend upwardly from the lower edge 205 of the retainer wall 199. The slots 201 are parallel to one another and have a "V" shape for receiving the edge surfaces of individual wafers. The slots 201 are spaced 3/16 of an inch apart from the center of one slot 201 to the center of the adjacent slot 201. The spacing corresponds to the slot spacing in the plastic boats. In between the slots 201 are square shaped grooves 207 that are parallel to the slots. The grooves 207 are wider than the slots 201.

The operation of the transfer apparatus for type II quartz boats can be divided into three phases. Since the type II quartz boat can hold twice as many wafers as one plastic boat, two plastic boats must be used to fully load the quartz boat. Thus, the first phase involves transferring the wafers from a first plastic boat to the quartz boat and is carried out as described hereinabove for the type I quartz boat. The first phase results in every other slot in the quartz boat having a wafer. In the second phase, the operator substitutes a second full plastic boat for the first empty plastic boat. The transfer apparatus automatically indexes the quartz boat to position the empty slots so as to receive the wafers from the second plastic boat, as delivered by the retainer hat 65. The quartz boat is indexed by an indexing cylinder 209 which moves the quartz boat 3/32 inches in a longitudinal direction. The indexing cylinder 209, which is spring biased in one position, receives air from the indexing valve 194 whenever the valve is opened by the reduction means 191. The indexing cylinder 209 moves the quartz boat placement block 53 and thus the quartz boat 13. The third phase is identical to the first phase in that wafers are transferred from the second plastic boat to the quartz boat. As the retainer walls 199 enter the quartz boat with the wafers from the second plastic boat, the wafers from the first plastic boat, which are already in the quartz boat, are received by the square grooves 207. The grooves 207 do not contact the wafers from the first plastic boat. In this manner, the second set of wafers, from the second plastic boat, are deposited in the quartz boat.

The transfer apparatus of the present invention can be used for transferring wafers to and from type III quartz boats. A type III quartz boat contains 50 wafers which are arranged in 25 double width slots. Two wafers are in each slot of the quartz boat. The wafers in each slot are arranged in a back-to-back configuration, wherein the back surfaces of the wafers contact each other (see FIG.

17). The slots in the quartz boat are spaced 3/16 inches apart.

The transfer apparatus used in transferring wafers to and from a type III quartz boat is similar to the transfer apparatus used for transferring wafers to and from a type II quartz boat with the following exceptions: the retainer wall 211 in the retainer hat 65 has a different slot configuration; and some additional operational steps are required for type III quartz boats. In addition, the quartz boat is tilted 1.5–3.0 degress in a longitudinal direction, to facilitate back-to-back loading of the wafers into the quartz boat.

Figure 17:
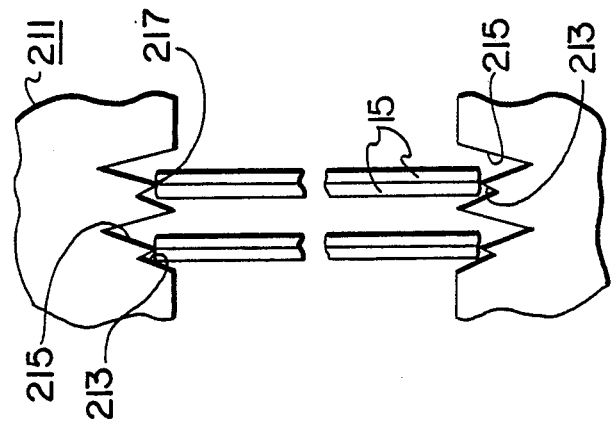
FIG. 17 is a schematic top view of a portion of a pair of retainer walls which are used in conjunction with still other types of closed bottom quartz boats.

Referring to FIG. 17, a top view of portions of two retainer walls 211 is shown. Each retainer wall has sets of slots 213 on its inside surface. Each set has a shallow "V" shaped slot 213 and a deeper "V" shaped slot 215. All of the slots are parallel to one another and all extend upwardly from the lower edge of the retainer wall. The shallow slots 213 are spaced 3/16 inches apart from one another; likewise, the deeper slots 215 are spaced 3/16 inches apart. The slot sets in the first retainer wall correspond to the slot sets in the second retainer wall such that the shallow slots in one retainer wall correspond to the shallow slots in the other retainer wall. The shallow and deeper slots in a set are separated from one another by a sharp edge 217.

The operation of the transfer apparatus for type III quartz boats can be divided into three phases. The first phase involves transferring the wafers from a first plastic boat to the quartz boat and is carried out as described hereinabove for the type I quartz boat. The plastic boat wafers are received by the shallow slots 213 of the retainer walls 211. The first phase results in every slot in the quartz boat having a wafer. In the second phase, the operator substitutes a second full plastic boat for the first empty plastic boat. However, the second plastic boat is reversed 180 degrees from the orientation of the first plastic boat so that the front surfaces of the wafers in the second plastic boat face the direction opposite to that faced by the front surfaces of the first plastic boat wafers. The transfer apparatus automatically indexes the quartz boat 0.02 inches in a longitudinal direction using the indexing cylinder 209. The third phase is identical to the first phase in that the wafers are transferred from the second plastic boat to the quartz boat. As the retainer walls 211 enter the quartz boat with the wafers from the second plastic boat, the wafers from the second plastic boat slide down along the back surfaces of the first plastic boat wafers. The first plastic boat wafers are received by the deeper slots 215 in the retainer walls. The deeper slots 215 are wider than the shallow slots 213, so the deeper slots 215 do not contact the first plastic boat wafers with both surfaces of the "V".

When removing the wafers from the quartz boat, the sequence is reversed. The back-to-back wafers 15 have some adhesion between their back surfaces. This adhesion is broken by the retainer wall sharp edges 217, as the retainer walls descend into the quartz boat.

Figure 18:
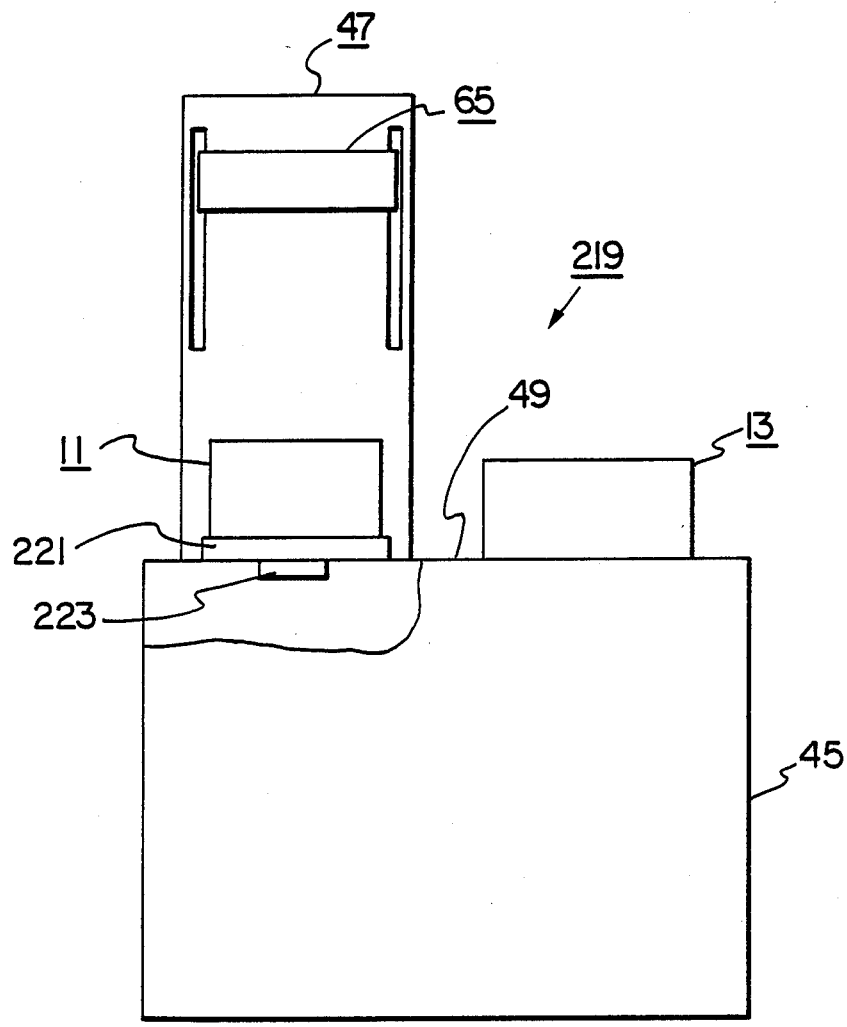
FIG. 18 is a schematic front view of the apparatus of the present invention, in accordance with another embodiment.

In FIG. 18, there is shown the transfer apparatus 219 of the present invention, in accordance with another embodiment. This embodiment is used for type IV quartz boats, which contain 25 wafers in 13 double width slots. The slots are spaced ⅜ inches apart or twice the spacing of plastic boat slots. Twenty four of the wafers in this type of quartz boat are arranged in back-to-back configurations, with the 25th wafer being by itself in a slot in a quartz boat.

The transfer apparatus 219 used for type IV quartz boats is similar to the transfer apparatus 43 used for types I–III quartz boats, except that the plastic boat placement block includes a turntable 221 that is rotatable over 180 degrees about a vertical axis. A turntable cylinder 223 provides the means for turning the turntable 221. The turntable 221 has slots 225 for receiving the wafer elevator 61.

The turntable also has alignment notches 227 for receiving the legs 28 of a plastic boat 11. In transferring wafers from the plastic boat to the quartz boat, the retainer walls of the retainer hat 65 pick up one half of the wafers in the plastic boat. The plastic boat is then rotated 180 degrees by rotating the turntable. This reorients the wafers remaining in the plastic boat for back-to-back placement into the quartz boat. In order for the remaining wafers in the plastic boat to be in proper alignment with the retainer wall slots, the alignment notches in the turntable are offset from the center of the turntable thereby offsetting the plastic boat. The alignment notches have a transverse center line located between the notch ends and oriented perpendicularly to the longitudinal axis of each alignment notch. The center line of the notches is offset 1/32 inches from the turntable center.

Figure 21:
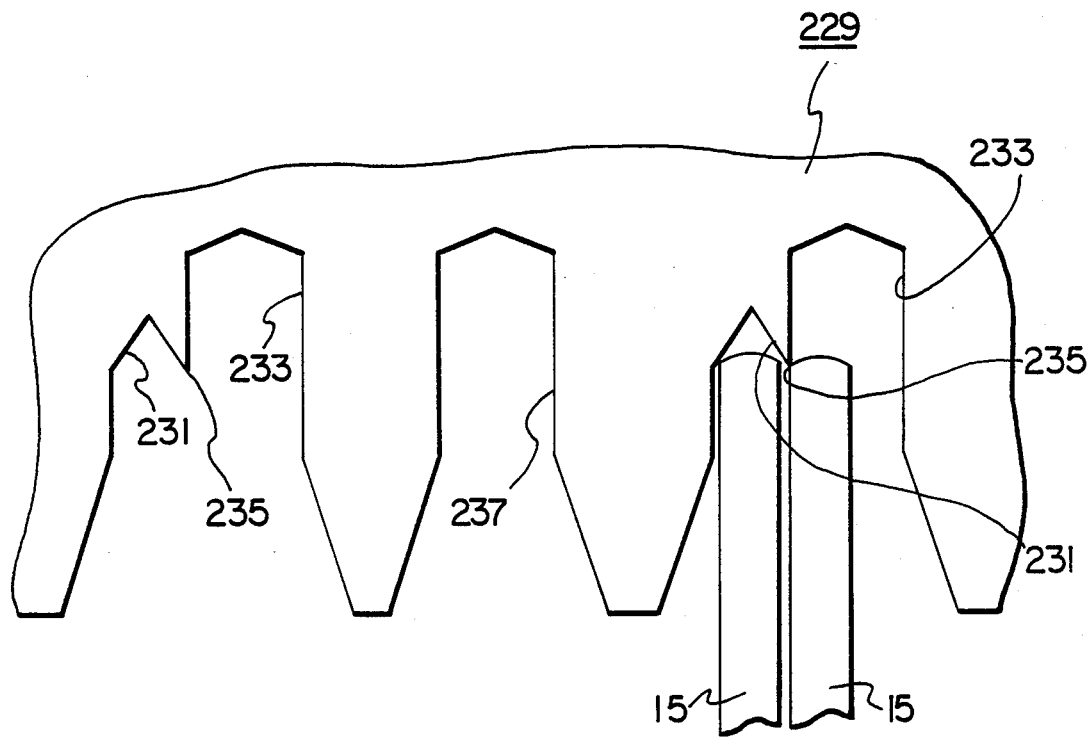
FIG. 21 is a schematic top view of a portion of a retainer wall which is used in conjunction with still other types of closed bottom quartz boats.

In FIG. 21, a detailed top view of a portion of one of the retainer walls 229 is shown. The retainer wall 229 has three types of slots, all of which are parallel to one another. A shallow "V" shaped slot 231 receives the edge surfaces 17 of the wafers 15 and actually retains the wafers during the transfers. The shallow slots 231 are located ⅜ inches apart from each adjacent shallow slot. Adjacent to each shallow slot is a second slot 233 which is deeper and wider than a shallow slot 231. A sharp edge 235 separates the shallow slot 231 and the second slot 233. The sharp edge 235 is used, as described above, to separate the back-to-back wafers in the quartz boat. A third type of slot 237, which is as deep and as wide as the second type of slot 233, is located between each shallow slot 231. The shallow slots 231 are spaced 3/16 inches apart from each adjacent third type of slot 237.

Figure 22:
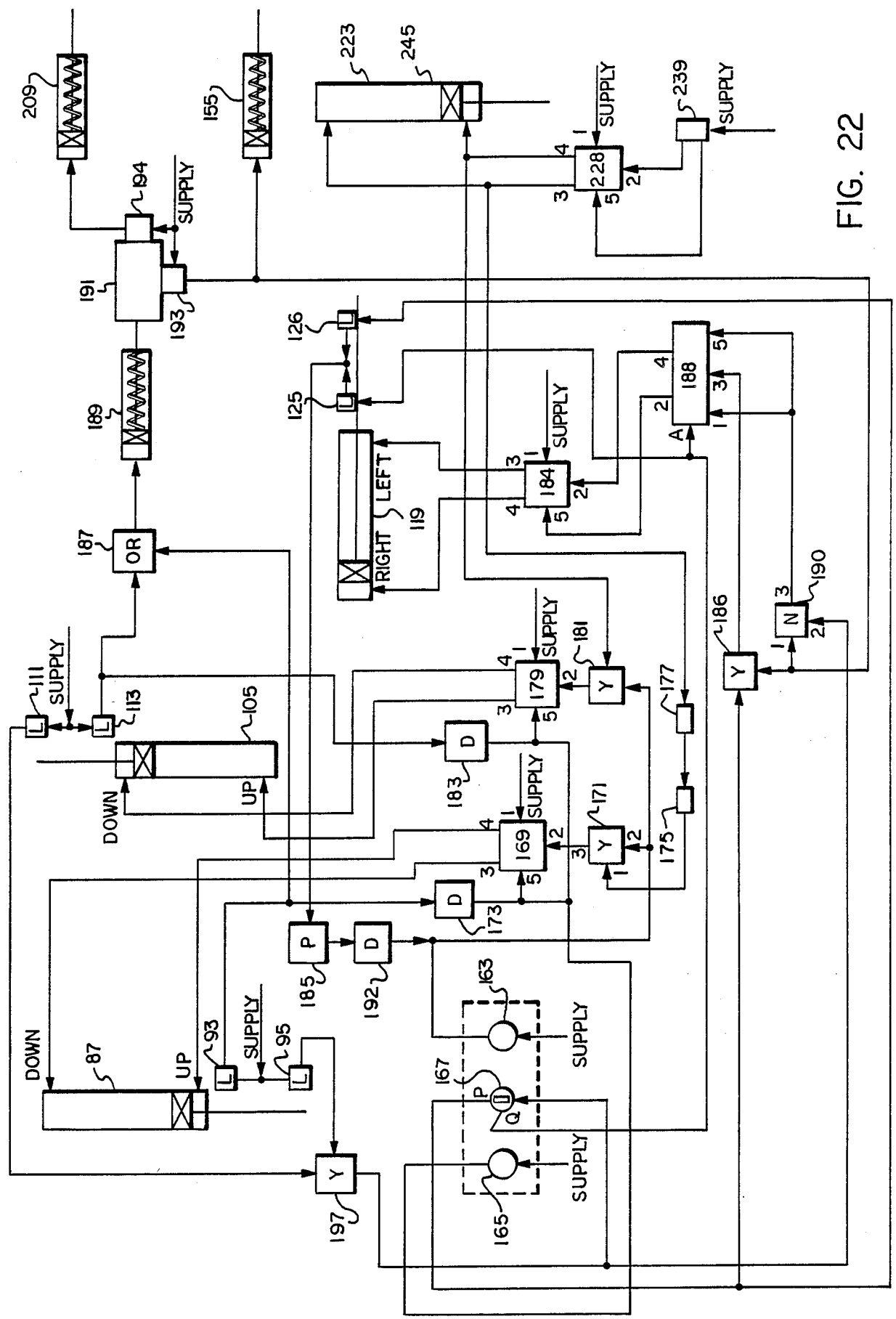
FIG. 22 is a schematic diagram of the pneumatic logic circuit which is used to control the operation of the apparatus of FIG. 18.

The operation and the transfer apparatus 219 will now be described. The first phase involves transferring one half of the wafers in the plastic boat to the quartz boat. In the following discussion it will be helpful to refer to the wafers in the plastic boat in a numerical sequence, starting at one end of the plastic boat with the first wafer and ending at the other end with the twenty-fifth wafer. As the wafer elevator 61 brings the plastic boat wafers up to the retainer hat 65, every odd numbered wafer is retained by the shallow slots 231 of the retainer walls. Every even numbered wafer is received by the third slot 237 but are not retained because of the excessive widths of the third slots. Once the odd numbered wafers are retained by the retainer hat, the wafer elevator descends back into the enclosure. The retainer hat 65 transfers the odd numbered wafers into the quartz boat and then returns for the even numbered wafers. An operator opens valve 239 (see FIG. 22) to apply air pressure to port 2 of the turntable cylinder latch module 238, wherein the turntable cylinder 223 rotates the plastic boat 11 180 degrees; because of the offset of the alignment notches 227 in the plastic boat, the even numbered wafers are rotated into the same positions (relative to the retainer wall shallow slots 231) that the odd numbered wafers were originally in. The even numbered wafers now face the opposite direction from the odd numbered wafers. The output ports 3 and 4 of the latch module 238 are connected to the YES modules 171, 181 to prevent elevator or retainer hat movement before the turntable has rotated. The wafer elevator brings the even numbered wafers up to the retainer hat 65, where the retainer walls close and the shallow slots 231 receive the wafers. Before the even numbered wafers are transferred to the quartz boat, the quartz boat, which is tilted 3 degrees longitudinally, is longitudinally indexed 0.02 inches. The even numbered wafers are then transferred to the quartz boat thereby completing the process.

Figure 23:
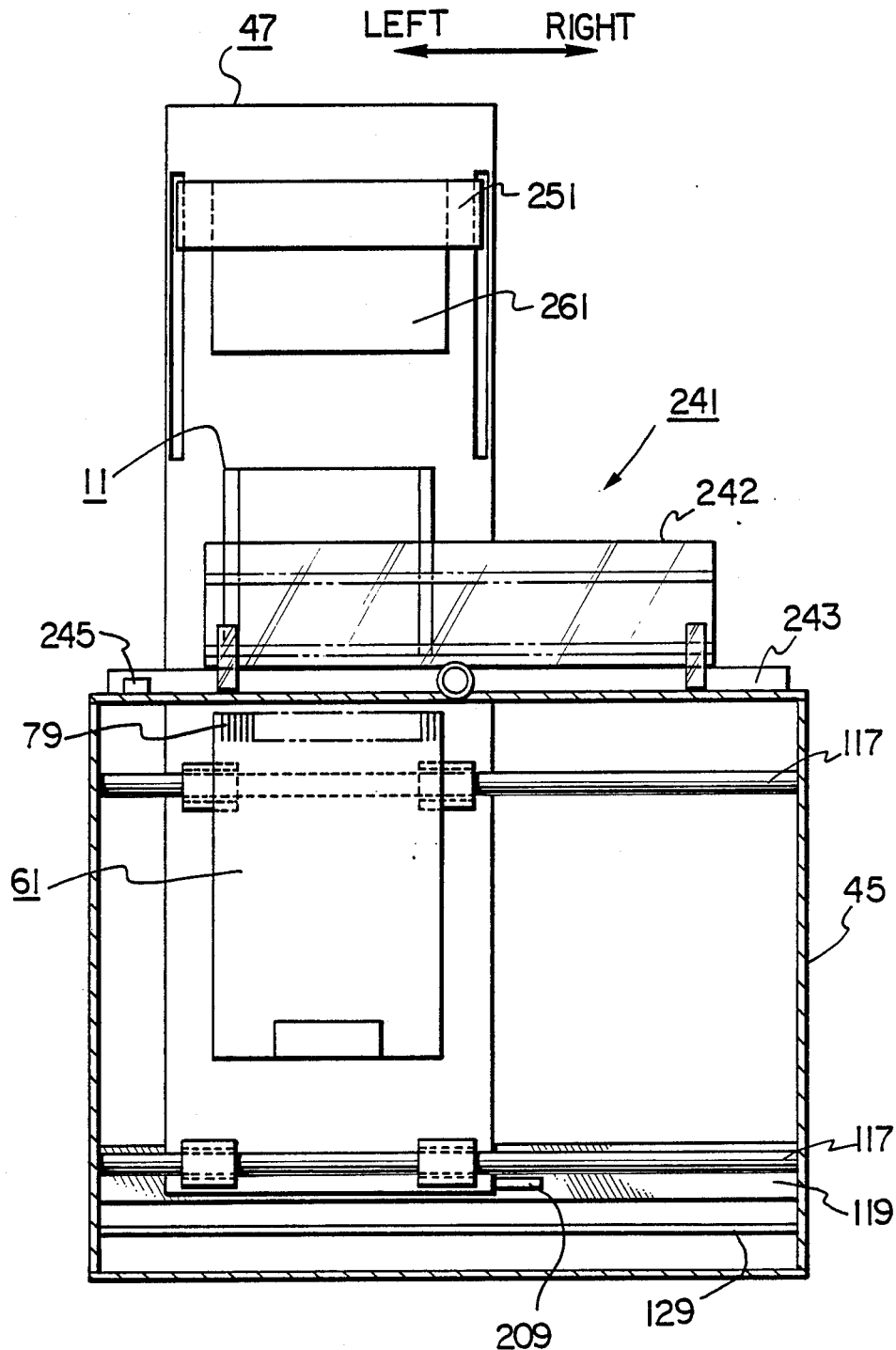
FIG. 23 is a schematic front view of the apparatus of the present invention with the enclosure cut away, in accordance with still another embodiment.
Figure 24:
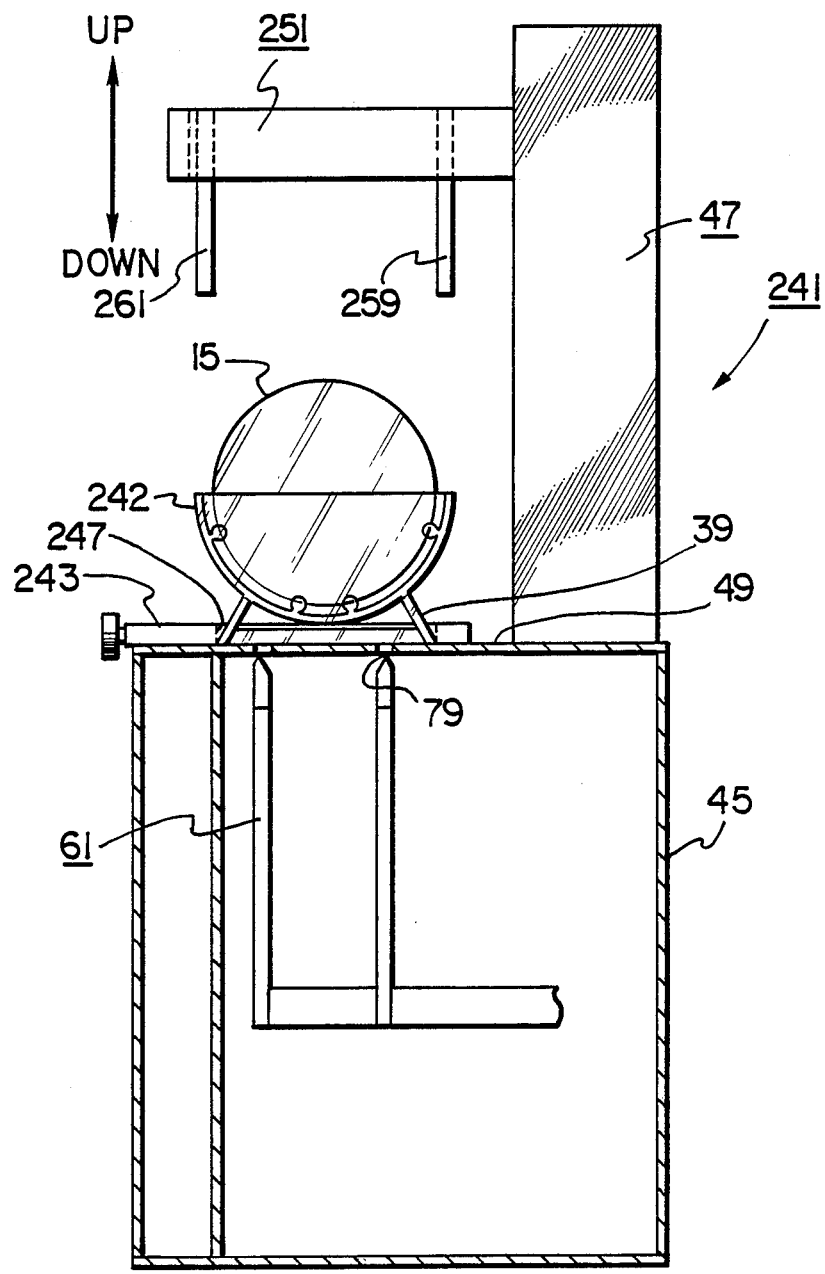
FIG. 24 is a schematic right side view of the apparatus of FIG. 17, with the quartz boat in the "out" position.
Figure 25:
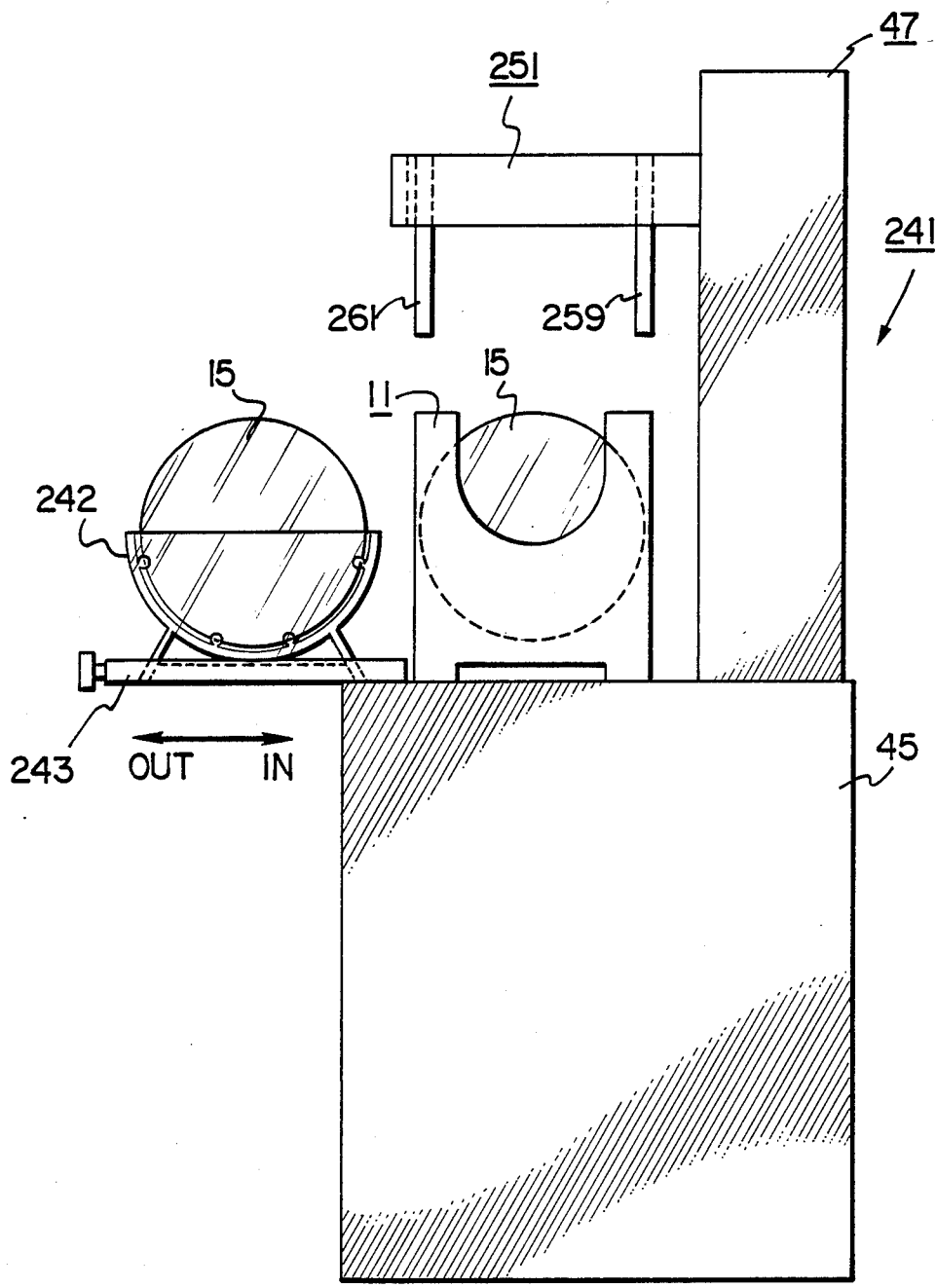
FIG. 25 is a schematic right side view of the apparatus of FIG. 17, with the quartz boat in the "in" position.

In FIGS. 23–25 there is shown the transfer apparatus 241 of the present invention, in accordance with still another embodiment. This embodiment is used for types V–VII quartz boats 242, which quartz boats are 14 inches long, or more than twice the length of a plastic boat. The transfer apparatus 241 is similar to the transfer apparatus 43 of FIGS. 3–5, except: the quartz boat 242 is located on a slideable placement table 243; and the retainer hat has a different pivoting arrangement for the retainer walls.

Figure 19:
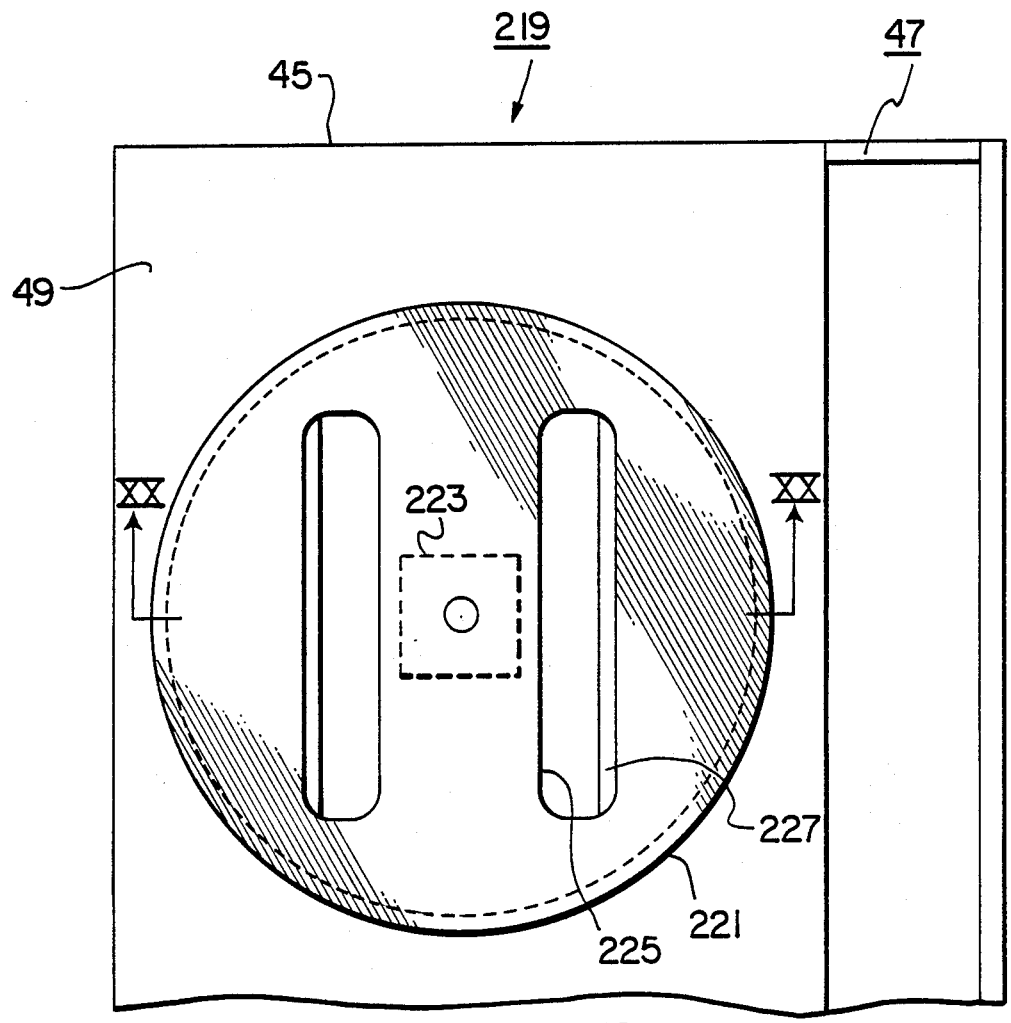
FIG. 19 is a schematic detail top view of the turntable in the apparatus of FIG. 14.
Figure 20:
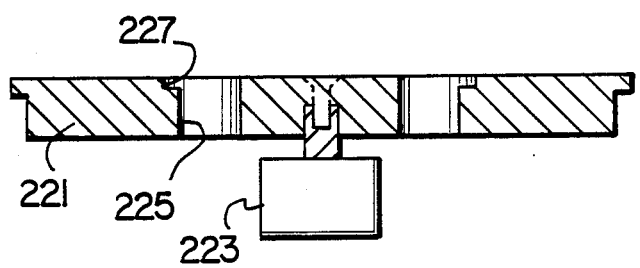
FIG. 20 is a cross-sectional view of the turntable, taken at lines XX—XX of FIG. 19.

The placement table 243 slides onto the top portion 49 of the enclosure 45. The placement table 243 slides between an "in" position, wherein the table is directly under the retainer hat 251 (see FIG. 19), and an "out" position, wherein the table is out in front of the retainer hat (see FIG. 18). A placement table cylinder 245 provides the motive power necessary to automatically move the table 243 in and out. The placement table 243 is oriented so that the retainer hat 251 can move along the length of the table 243 and any long quartz boat 242 in place on the table. The placement table 243 has alignment notches 247 for receiving the legs 39 of a quartz boat 13. The top portion of the enclosure has two sets of alignment notches (not shown) for first and second placement boats, which notches are covered by the placement table 243 when in the "in" position. The plastic boat alignment notches are arranged so that when the table 243 is in the "out" position two plastic boats arranged in end to end fashion with each other can be put on the top portion 49 of the enclosure 45. The wafer elevator 61 moves with the main assembly 47 to push wafers out of either the first plastic boat or the second plastic boat, depending upon the type of quartz boat used.

Figure 26:
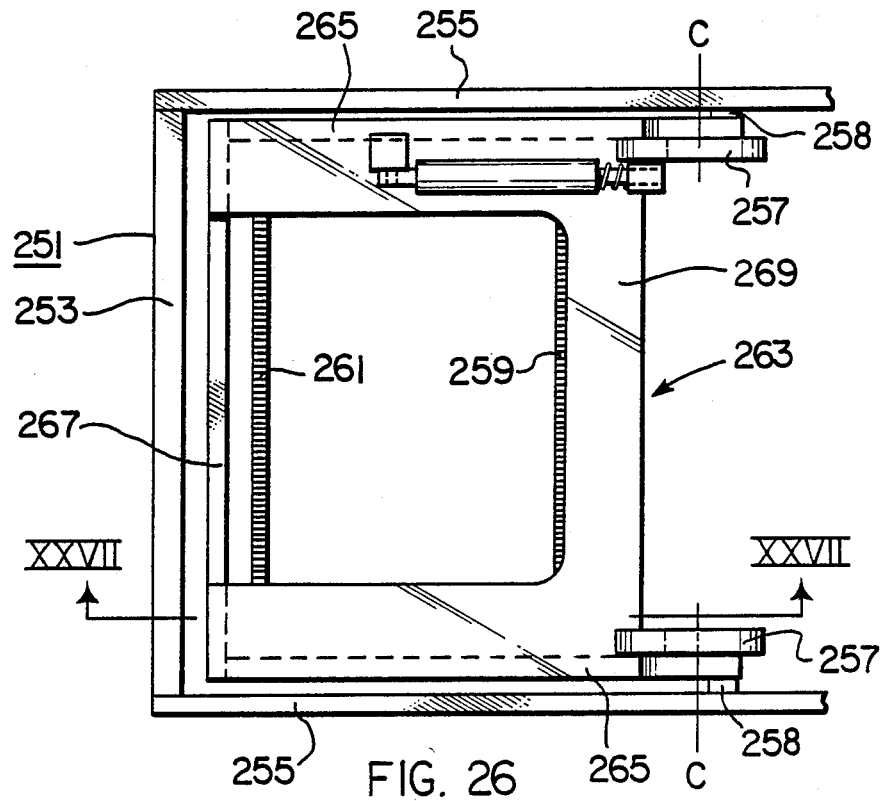
FIG. 26 is a schematic top plan view of the retainer hat used in conjunction with the apparatus of FIG. 17.
Figure 27:
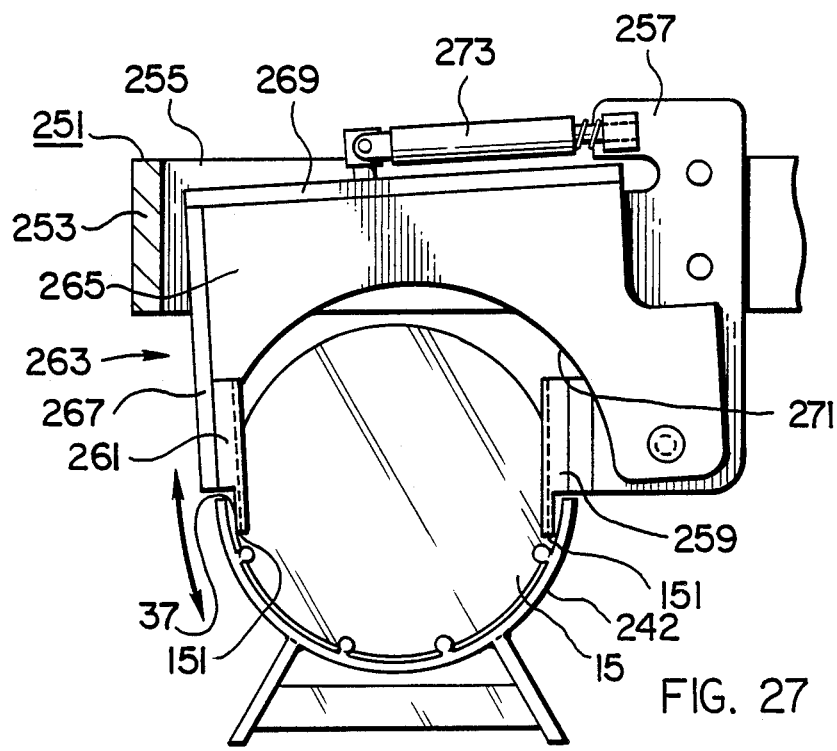
FIG. 27 is a schematic right side view of the retainer hat of FIG. 20.

The retainer hat 251 is shown in FIGS. 26 and 27. The retainer hat 251 has a frame formed by a frontmost cross support member 253 and two lateral support members 255 which extend rearwardly to the mounting member 63. A mounting plate 257 is coupled via spacers 258 to the inside surface of each lateral support member 255. The mounting plates 257 are located near the mounting member 63 and depend from the lateral support members 255. Spanning between the mounting plates 257 is a first retainer wall 259 which is fixedly coupled to the mounting plates lower ends. A second retainer wall 261 is suspended across from the first retainer wall 259 by a second retainer wall support assembly 263. The support assembly 263 has two side plates 265, a retainer wall mounting plate 267, and an overhead plate 269. The side plates 265 are pivotally coupled to the lower ends of the mounting plates 257. The side plates 265 extend in an arcuate manner from the mounting plates 257 to the retainer wall mounting plate 267. The lower edge 271 of the side plates 265 is arcuate so as not to interfere with any wafers in the quartz boat. The retainer wall mounting plate 267 extends between the front ends of the side plates 265 and the overhead plate 269 adds rigidity to the support assembly 263 by connecting the top edges of the side plates 265 and the retainer wall mounting plate 267. The second retainer wall 261 is coupled to the lower end of the retainer wall mounting plate 267. A retainer hat cylinder 273 pivots the second retainer wall 261 in a generally up and down direction, about the pivot axis C. One end of the retainer hat cylinder 273 is connected to the upper end of one of the mounting plates 257 and the other end is connected to the overhead plate 269, at a position which is towards the retainer wall mounting plate 267.

The retainer hat 251 shown in FIGS. 26 and 27 is preferred for use with long quartz boats 242 because, unlike the retainer hat 65 of FIGS. 6 and 7, there are no obstructions at the ends of the retainer walls which could interfere with wafers in the quartz boat. Because the quartz boats 242 are more than twice as long as the plastic boats, the retainer hat must descend into each long quartz boat at least twice to transfer wafers.

As with the retainer hat 65 of FIGS. 6 and 7, the retainer walls 259, 261 contact each wafer at points located beneath the center of gravity of the wafer. The fixed retainer wall 259 contacts each wafer at a point just slightly below the center of gravity, while the pivotal second retainer wall 261 contacts each wafer at a point further below the center of gravity.

The retainer walls 259, 261 have parallel slots in arrangements discussed hereinabove. The particular arrangement depends on the type of quartz boat being transferred to. This will be explained in more detail hereinbelow.

The operation of the transfer apparatus will now be described, with regard to a type V quartz boat. A type V quartz boat contains 25 wafers spaced ⅜ inches apart or twice the distance between plastic boat wafers. For a type V quartz boat, retainer walls having the slot configuration shown in FIG. 21 are used. The first phase involves transferring the odd numbered wafers from the plastic boat to the quartz boat. With the placement table 243 loaded with the quartz boat 242 in the "out" position, the plastic boat 11 is put into the left most set of alignment notches in the top portion of the enclosure 45. The wafer elevator 61 rises with the wafers and the retainer hat 251 retains the odd numbered wafers. The wafer elevator 61 descends and the plastic boat is removed by an operator. Then, the quartz boat 13 and the placement table 243 are automatically moved to the "in" position. The retainer hat 251 descends and deposits the wafers into the left portion of the quartz boat. The lower edges 151 of the retainer walls fit into the gaps 37 between the quartz boat shell and the edge surfaces of the wafers, as described hereinabove. The retainer hat 251 then rises, followed by the placement table 243 moving the quartz boat to the "out" position. The operator puts the same plastic boat into the leftmost alignment notches, with the plastic boat in its original orientation. Then, the plastic boat is indexed 3/16 inches to move the even numbered wafers to the original positions of the odd numbered wafers. The retainer hat 251 retains the even numbered wafers from the wafer elevator 61, and the main assembly 47 moves to the rightmost position. The operator removes the plastic boat and the placement table 243 moves the quartz boat to the "in" position. Next, the retainer hat 251 descends into the quartz boat and deposits the even numbered wafers in the right portion of the quartz boat. As the retainer hat 251 descends into the quartz boat, the left end of the retainer hat does not interfere with the wafers in the left portion of the quartz boat because of the pivoting arrangement of the second retainer wall 261 and the arcuate lower edge 271 of the side plate 265. After the retainer hat 251 rises to its upper position, the placement table 243 moves the quartz boat to the "out" position for removal by the operator.

The transfer apparatus 241 can also be used for transferring wafers to and from a type VI quartz boat. A type VI quartz boat contains fifty wafers spaced 3/16 inches apart, or the same spacing as used in plastic boats. Some modification of the transfer apparatus 241 is required to transfer to and from type VI quartz boats namely: the retainer walls and the retainer hat 251; and the operational steps involved in the transfer of wafers.

The retainer walls 233, 235 used with type VI quartz boats have the slot configuration shown in FIGS. 8 and 9.

The transfer operation requires two plastic boats. The first plastic boat is placed in the leftmost alignment notches by the operator. The quartz boat is located on the placement table 243 which is in the "out" position. The retainer hat 251 is positioned over the first plastic boat where the wafer elevator 61 delivers the wafers to the retainer walls in the retainer hat. The retainer walls retain all 25 wafers. The wafer elevators descend, the operator removes the plastic boat, and the placement table 243 moves the quartz boat to the "in" position. (See FIG. 22, where for purposes of the logic diagram, the placement table cylinder 245 is the same as the turntable cylinder 223 used in the turntable transfer apparatus 219.) The retainer hat 251 descends and deposits its wafers into the leftmost portion of the quartz boat. The retainer hat then ascends and the quartz boat is moved to the "out" position by the placement table 243. The retainer hat 251 and main assembly 47 move over to the rightmost position, and the operator puts a second full plastic boat into the rightmost alignment notches under the retainer hat 251. The wafers are then transferred to the retainer hat, which contains all of the wafers. The second plastic boat is removed by the operator and the quartz boat is moved to the "in" position. The retainer hat then descends and deposits the wafers into the rightmost portion of the quartz boat. Finally, the retainer hat ascends, and the quartz boat is moved to the "out" position, completing the transfer process.

The transfer apparatus 241 can also be used on a type VII quartz boat which contains 100 wafers spaced 3/32 inches apart or one half of the spacing of the plastic boat wafers. For a type VII quartz boat, retainer walls 233, 235 have the slot configuration shown in FIGS. 8 and 9. The transfer operation requires four plastic boats. The first plastic boat is placed in the leftmost alignment notches by the operator. The retainer hat 251 retains all of the wafers from the first plastic boat and transfers them to the quartz boat as described above. Then, the second plastic boat is put into the leftmost alignment notches and the retainer hat retains all of those wafers. However, before transferring the second plastic boat wafers to the quartz boat, the quartz boat is indexed longitudinally 1/32 inches. The indexing cylinder 209 is coupled to the moveable piston on the mounting member cylinder 119 and to the mounting member 63. Then, the second plastic boat wafers are transferred to the leftmost portion of the quartz boat. Next, a third plastic boat is placed into the rightmost alignment notches. The retainer hat retains all of the wafers from the third plastic boat and deposits the wafers into the rightmost portion of the quartz boat. A fourth plastic boat is placed into the rightmost alignment notches and all of the wafers therein are retained by the retainer hat. The quartz boat is indexed 1/32 inches longitudinally in a direction opposite to the first index direction. Then, the retainer hat deposits the wafers into the rightmost portion of the quartz boat.

Although the transfer apparatuses have been described with reference to seven different types of closed bottom quartz boats, the transfer apparatuses could be utilized for other types of closed bottomed quartz boats as well.

One aspect of the transfer apparatus of the present invention is its ability to operate in a liquid environment. Some types of semiconductor manufacturer under development now require the semiconductor wafers to be immersed in deionized water. The transfer apparatus of the present invention can transfer wafers even when totally submerged in water.

Another aspect of the transfer apparatus of the present invention is that the retainer walls of the retainer hat retain for transfer a large number of wafers at a time. The retainer walls retain either all 25 wafers or one half of the 25 wafers in a plastic boat. This capability of retaining and transferring large numbers of wafers simultaneously greatly reduces the time required for transfer wafers.

The foregoing disclosure and the showings made in the drawings are merely illustrative of the principles of this invention and are not to be interpreted in a limiting sense.

I claim:

1. An apparatus for automatically transferring wafers between first wafer container means and second wafer container means, said wafers being used in the manufacture of integrated circuits, each of said wafers having a center of gravity and an edge surface, said first container means having two opposite sides with a plurality of parallel slots for receiving said wafers by their edge surfaces and having an open bottom and an open top, said second container means having longitudinal support means with a plurality of parallel slots for receiving said wafers by their edge surfaces and having a closed bottom and an open top, comprising:

(a) first transfer means for transferring said wafers to and from said first container means, said first transfer means entering said first container means through said open bottom of said first container means, said first transfer means having a plurality of parallel slots for receiving said wafers by their edge surfaces and contacting said wafers at points below their centers of gravity;

(b) second transfer means for transferring said wafers to and from said second container means and for transferring said wafers to and from said first transfer means, comprising retainer means and movement means;

(c) said retainer means for retaining said wafers in the same relative orientation with respect to one another when said wafers are removed from a container means, said retainer means having first and second retainer wall means for supporting said wafers, each of said first and second retainer wall means each having a lower edge and an inside surface, said first and second retainer wall means oriented relative to one another such that said inside surfaces face each other, each of said first and second retainer wall means inside surfaces having a plurality of parallel slots for receiving said wafers by their edge surfaces;

(d) said first and second retainer wall means pivotable relative to one another between open and closed positions, said closed position being where said first and second retainer wall means contact said wafer edge surfaces at points located below the centers of gravity of said wafers, said open position being where said first and second retainer wall means are out of contact with said wafer edge surfaces and said retainer wall means can be inserted or removed from said second container means, said first and second retainer wall means pivotable between open and closed positions when said lower edges of said retainer wall means are inside of said second container means.

2. The apparatus of claim 1 wherein said retainer means moves between upper and lower positions, said upper position being where said retainer means transfers said wafers to and from said first transfer means, said lower position being where said retainer means transfers said wafers to and from said second container means.

3. The apparatus of claim 1 wherein said retainer means moves between first and second lateral positions, said first lateral position being where said retainer means transfers said wafers to and from said first transfer means and said second lateral position being where said retainer means transfers said wafers to and from said second container means.

4. The apparatus of claim 1 wherein said first and second retainer wall means each have an upper end portion and a lower end portion adjacent said lower edge, said lower end portion having a reduced thickness relative to said upper end portion, wherein said lower end portion is insertable into said second container means and in particular into a gap between said second container means and said wafer edge surfaces.

* * * * *